United States Patent
Mine et al.

(10) Patent No.: US 8,125,012 B2
(45) Date of Patent: Feb. 28, 2012

(54) NON-VOLATILE MEMORY DEVICE WITH A SILICON NITRIDE CHARGE HOLDING FILM HAVING AN EXCESS OF SILICON

(75) Inventors: Toshiyuki Mine, Fussa (JP); Kan Yasui, Kodaira (JP); Tetsuya Ishimaru, Kokubunji (JP); Yasuhiro Shimamoto, Tokorozawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 286 days.

(21) Appl. No.: 11/639,134

(22) Filed: Dec. 15, 2006

(65) Prior Publication Data

US 2007/0170495 A1   Jul. 26, 2007

(30) Foreign Application Priority Data

Jan. 23, 2006   (JP) ................. 2006-013276

(51) Int. Cl.
*H01L 21/336*   (2006.01)
*H01L 21/31*   (2006.01)

(52) U.S. Cl. ........ 257/300; 438/261; 438/287; 438/288; 438/791; 438/954; 257/E29.309; 257/311; 257/324; 257/365

(58) Field of Classification Search .......... 438/261, 438/287, 954, 288, 791; 257/E29.309, 300, 257/311, 324, 365
See application file for complete search history.

(56) References Cited

U.S. PATENT DOCUMENTS

| | | | | |
|---|---|---|---|---|
| 5,969,383 A | * | 10/1999 | Chang et al. | 257/316 |
| 6,555,436 B2 | * | 4/2003 | Ramsbey et al. | 438/279 |
| 6,642,573 B1 | * | 11/2003 | Halliyal et al. | 257/316 |
| 7,115,943 B2 | * | 10/2006 | Mine et al. | 257/324 |
| 2002/0006702 A1 | * | 1/2002 | Nuttall et al. | 438/261 |
| 2005/0062098 A1 | * | 3/2005 | Mahajani et al. | 257/324 |
| 2005/0199940 A1 | * | 9/2005 | Mine et al. | 257/315 |
| 2006/0124991 A1 | * | 6/2006 | Ohba | 257/324 |
| 2006/0261401 A1 | * | 11/2006 | Bhattacharyya | 257/316 |
| 2007/0048957 A1 | * | 3/2007 | Lee et al. | 438/324 |
| 2007/0082447 A1 | * | 4/2007 | Lu et al. | 438/264 |

FOREIGN PATENT DOCUMENTS

| | | |
|---|---|---|
| JP | 05-110114 A | 4/1993 |
| JP | 05-343694 A | 12/1993 |
| JP | 2004-186452 A | 7/2004 |

* cited by examiner

*Primary Examiner* — Kevin Parendo
(74) *Attorney, Agent, or Firm* — Miles & Stockbridge P.C.

(57) ABSTRACT

Performance of a non-volatile semiconductor storage device which performs electron writing by hot electrons and hole erasure by hot holes is improved. A non-volatile memory cell which performs a writing operation by electrons and an erasure operation by holes has a p-type well region, isolation regions, a source region, and a drain region provided on an Si substrate. A control gate electrode is formed via a gate insulating film between the source region and the drain region. In a left-side side wall of the control gate electrode, a bottom Si oxide film, an electric charge holding film, a top Si oxide film, and a memory gate electrode are formed. The electric charge holding film is formed from an Si nitride film stoichiometrically excessively containing silicon.

5 Claims, 19 Drawing Sheets

FILM THICKNESS RATIO Rt

Rt=($Si_3N_4$ FILM)/($Si_3N_4$ FILM + SRN FILM)

COMPOSITION OF SRN FILM
X=0.2

| SAMPLE | FLOW RATE RATIO | REFRACTIVE INDEX | COMPOSITION ; X |
|---|---|---|---|
| A | 10 | 2.001 | 0 |
| B | 2 | 2.114 | 0.07 |
| C | 1.33 | 2.231 | 0.14 |

| OPERATION | Vmg | Vs | Vd | Vcg | Vsub |
|---|---|---|---|---|---|
| WRITE | 12V | 5V | 1V | 1.5V | 0V |
| ERASURE | −6V | 6V | 1.5V | 0V | 0V |
| READ | −5~7V | 0V | 1V | 1.5V | 0V |

FILM THICKNESS RATIO Rt

Rt=($Si_3N_4$ FILM)/($Si_3N_4$ FILM + SRN FILM)

COMPOSITION OF SRN FILM X=0.2

| SAMPLE | $t_{SRN}$ | $t_{Si_3N_4}$ | Rt | n | x |
|---|---|---|---|---|---|
| A | 0 | 10 | 0 | — | — |
| D | 4 | 6 | 0.4 | 2.39 | 0.2 |
| E | 6 | 4 | 0.6 | 2.39 | 0.2 |

| SAMPLE | FILM THICKNESS RATIO | SRN REFRACTIVE INDEX | SRN COMPOSITION ; X |
|---|---|---|---|
| A | 0 | — | — |
| F | 1 | 2.114 | 0.07 |
| G | 0.4 | 2.39 | 0.2 |

| OPERATION | Vg | Vs | Vd | Vsub |
|---|---|---|---|---|
| WRITE | 10V | 5V | 0V | 0V |
| ERASURE | −6V | 6V | 2.5V | 0V |
| READ | −5~7V | 2V | 0V | 0V |

DISTANCE FROM SOURCE END

DISTANCE FROM SOURCE END

NON-VOLATILE MEMORY DEVICE WITH A SILICON NITRIDE CHARGE HOLDING FILM HAVING AN EXCESS OF SILICON

CROSS-REFERENCE TO RELATED APPLICATION

The present application claims priority from Japanese patent application No. JP 2006-13276 filed on Jan. 23, 2006, the content of which is hereby incorporated by reference into this application.

TECHNICAL FIELD OF THE INVENTION

The present invention relates to non-volatile semiconductor storage devices and manufacturing techniques thereof, and particularly relates to highly-reliable non-volatile semiconductor storage devices which are programmable by low voltages and at high speed and manufacturing techniques thereof.

BACKGROUND OF THE INVENTION

A typical example of a non-volatile memory (non-volatile semiconductor storage device) which uses an insulating film as a storage node is a MONOS (Metal-Oxide-Nitride-Oxide-Semiconductor) memory. The MONOS memory is composed of a laminated structure of a conductive gate electrode (M), an Si oxide film (O), an Si nitride film (N), an Si oxide film (O), and a semiconductor substrate (S) and stores information by injecting or emitting carriers (electric charge) into or from the Si nitride film having an electric charge holding function.

The Programming method of the non-volatile memory is selected in accordance with the use thereof. For example, in a most typical method, via an extremely thin Si oxide film (tunnel oxide film) positioned in a layer below an Si nitride film which is an electric charge holding film, electrons are subjected to FN (Fowler Nordheim) tunnel injection (write) from a silicon substrate (semiconductor substrate) (hereinafter, referred to as an Si substrate) to the Si nitride film, while FN tunneling emission (erasure) is performed from the Si nitride film to the Si substrate.

An example of the FN writing/erasure method of electrons via the tunnel oxide film (about 2 nm) is disclosed in Japanese Patent Application Laid-Open Publication No. 5-343694 (Patent Document 1), in which an Si nitride film stoichiometrically excessively containing Si is used in order to increase trap density of the electric charge holding film.

Meanwhile, recently, demands for MONOS memories of hot electron writing (injection)/hot hole erasure methods in which rewriting can be performed by low voltages and at high speeds are increasing. The cell structures of the MONOS memories using hot electron injection and hot hole erasure can be broadly divided into two, i.e., a structure in which a memory MONOS transistor, which stores information, and a selective MOS transistor, which selects a cell, are not separated from each other and a structure in which they are separated. For example, a technique of the former method is disclosed in Japanese Patent Application Laid-Open Publication No. 5-110114 (Patent Document 2), and a technique of the latter method is disclosed in Japanese Patent Application Laid-Open Publication No. 2004-186452 (Patent Document 3).

Hereinafter, the structure and operation of a non-volatile memory cell disclosed in Patent Document 3 will be simply described by using FIG. 28.

This non-volatile memory cell is composed of two MOS transistors, i.e., a memory MONOS transistor which constitutes a storage unit and a selective MOS transistor for selecting the storage unit and reading information. This is a so called split-gate type MONOS memory, and both the transistors generally use N-type transistors. Hereinafter, the memory MONOS transistor and the selective MOS transistor are referred to as a memory transistor and a selective transistor, respectively.

The memory transistor and the selective transistor are formed in an active region separated by an isolation region 302 formed in an Si substrate 301. The selective transistor has a control gate electrode 304 via a gate insulating film 303 formed on the Si substrate 301. The memory transistor is formed by the side wall which is in the left side of the control gate electrode 304 in the drawing, and a sidewall 311 is formed in the side wall which is in the right side in the drawing.

A drain region (diffusion layer) 310 of the selective transistor is connected to a bit line, and the control gate electrode 304 is connected to control gate wiring. On the other hand, a source region (diffusion layer) 309 of the memory transistor is connected to a common line, and a memory gate electrode 308 is connected to a word line. Note that, since the names of the source region 309 and the drain region 310 are different depending on the voltage relation during a reading operation, they are sometimes called by the opposite names.

Herein, since there are two gate electrodes, the gate electrode of the selective transistor is described as a control gate electrode, and the gate electrode of the memory transistor is described as a memory gate electrode.

A capacitance insulating film of the memory transistor is composed of a three-layer film. It is composed of, from the surface side of the Si substrate 301, an Si oxide film (first layer film) 305, an Si nitride film (second layer film) 306, and an Si oxide film (third layer film) 307. The film thicknesses of the first layer film to the third layer film are about 6 nm to 7 nm, about 8 nm to 9 nm, and about 7 nm to 8 nm, respectively. In the above described memory transistor, the Si nitride film 306 which is the second layer film is an electric charge holding insulating film having a carrier holding function and captures carriers (electric charge) in a trap level which is present in a depth of about 1.4 eV to 1.6 eV from the conduction band or the valence band of the Si nitride film. The Si oxide film 305 of the first layer film and the Si oxide film 307 of the third layer film are potential barrier films and prevent leakage of carriers from the Si nitride film 306 to outside and inflow of carries from outside.

Generally, in formation of the Si oxide film 305 of the first layer film, a silicon oxide film obtained by subjecting the Si substrate 301 to heat treatment in an oxidizing atmosphere is employed. In formation of the Si nitride film 306 of the second layer film, chemical vapor deposition (CVD method: Chemical Vapor Deposition) using dichlorosilane ($SiH_2Cl_2$) and ammonia ($NH_3$) as raw material gases is employed, and ammonia that is five times or more the flow rate of dichlorosilane is introduced. Formation of the Si oxide film 307 of the third layer film can employ a thermal oxidation method and a CVD method; and, in the thermal oxidation method, the Si nitride film 306 is oxidized in an oxidizing atmosphere, thereby forming the Si oxide film 307. On the other hand, in the CVD method, the Si oxide film 307 is deposited on the Si nitride film 306 by using dichlorosilane and nitrous oxide ($N_2O$) as raw material gases. Hereinafter, the Si oxide film 305 which is the first layer film is described as a bottom Si oxide film, and the Si oxide film 307 which is the third layer film is described as a top Si oxide film. Also, since the above described three-layer film is generally referred to as an ONO film, the three-layer film will be also described as an ONO film.

Typical operations of the memory cell structure will next be described. The potential of the source region 309, the potential of the drain region 310, the potential of the control gate electrode 304 of the selective transistor, and the potential of the memory gate electrode 308 of the memory transistor will be described as Vs, Vd, Vcg, and Vmg, respectively.

In a writing operation, for example, Vs=5V, Vmg=10V, Vcg=0.4V, and Vd=0V, and these potentials are applied as pulses, for example, for one microsecond. An extremely large electric field is applied to the surface of the Si substrate 301 that is immediately below the extremely narrow region electrically insulating the selective transistor from the memory transistor. Channel electrons therein accelerated by the electric field become hot electrons, and part of them is drawn into the memory gate electrode 308 side and injected into the Si nitride film 306 by the large electric field of the memory gate electrode 308.

In an erasure operation, for example, Vs=8V, Vmg=−6V, Vcg=0V, and Vd=0V, and these potentials are applied as pulses, for example, for 100 microseconds. In an end of the source region 309, band-to-band tunneling occurs because of an extremely large electric field, and hot holes are generated. Part of the hot holes are drawn to the memory gate electrode 308 side and injected into the Si nitride film 306 by the large electric field of the memory gate electrode 308.

In a reading operation, for example, Vs=0V, Vmg=1.5V, Vcg=1.5V, and Vd=1.5V. In other words, the selective transistor is caused to be in an on state, an potential that is between a threshold value of a write state and a threshold value of an erasure state is applied to the memory gate electrode 308 of the memory transistor. Accordingly, the memory cell to which electrons are injected maintains an off state, while the memory cell to which holes are injected becomes an on state; thus, binary information can be read.

As described above, even when the thickness of the bottom Si oxide film is increased, a MONOS memory using carries of both the electric charge types enables low-voltage and high-speed programming which cannot be realized by the FN injection/FN erasure method.

SUMMARY OF THE INVENTION

Although the electron writing using hot electrons and hole erasure using hot holes enable low-voltage and high-speed programming, it is difficult to increase the number of rewriting. This is for the reason that the hole erasure using hot holes deteriorates the film quality of the bottom Si oxide film, and the film quality deterioration leads to significant reduction in the data holding characteristic. Deterioration in the data holding characteristic include a deterioration mode in which a threshold voltage (Vth) in the writing side is reduced along with left time (deterioration is maximum at a high temperature) and a deterioration mode in which Vth in the erasure side increases (deterioration is maximum in the vicinity of room temperature), and increase in Vth the erasure side particularly makes the increase in the number of rewriting difficult. Therefore, in the MONOS memory using the hot electrons and hot holes in programming, how to reduce the injection amounts of both the electric charges so as to prevent deterioration of the film quality of the bottom Si oxide film is a key to improve rewriting durability.

The present inventors have carried out detailed study and, as a result, found out that the phenomenon in which the both electric charges are locally present in the electric charge holding film is the cause which increases the electric charge injection amounts along with rewriting. Specifically, since the injection positions of electrons and holes into the electric charge holding film are different in terms of energy and space, even when an erasure operation is performed, both the electric charges are not completely erased but are locally present. This phenomenon is a phenomenon specific to a both electric charge type MONOS memory and does not occur in a MONOS memory using a single electric charge type (merely electrons).

First of all, a problem due to the difference between the injection positions in terms of energy of both the electric charges will be described by using FIG. 29. FIG. 29 is a diagram schematically showing a band diagram of a flat band state of the memory transistor. Both the electrons and holes are injected into the electric charge holding film from the Si substrate side via the bottom Si oxide film. Most of injected electrons are captured in a trap level close to the conduction band of the electric charge holding film; on the other hand, holes are captured by a trap level close to the valence band. The difference in the potentials of both the trap levels is about 1.2 eV to 1.6 eV. Although most of the holes injected into the electric charge holding film by the erasure operation are recombined with the captured electrons and vanished, the electric charge of the part that cannot be recombined remains in the electric charge holding film. However, since the lines of the electric forces of both the electric charges cancel out each other, the electric field applied to the Si substrate is in the state that is approximately same as the state in which there is no electric charge. Upon recombination of the electrons and the holes, energy corresponding to the energy difference between the trap levels is emitted, and this energy cuts the combinations in the ONO film; thus, deterioration of the film quality of the ONO film is caused.

A problem due to the difference in the injection positions in terms of space will next be described by using FIG. 30. FIG. 30 is a cross sectional schematic diagram of the split-gate type MONOS memory. Most of the electrons injected from the drain region 310 side into the electric charge holding film (Si nitride film 306) via the selective transistor upon writing are injected into a region (right side in the diagram) close to the selective transistor. On the other hand, most of the holes injected from the end of the source region 309 into the electric charge holding film upon erasure are injected into a region (left side in the diagram) close to the source region 309.

FIG. 31 shows the electric charge density distribution in the electric charge holding film after electron/hole injection. The horizontal axis in FIG. 31 indicates the distance from the end of the source region 309 of the memory transistor shown in FIG. 30, and the vertical axis indicates absolute values of the electric charge density of the captured electric charges. Ideally, the electric charge density distributions of the electrons and the holes are preferred to be the same distribution. However, since the injection positions of both the electric charges are different in terms of space in the split-gate type MONOS memory, the peak positions of the captured distributions of the electrons and holes after electric charge injection in the electric charge holding film are largely different as shown in FIG. 31.

FIG. 32 shows electric charge distributions in the electric charge holding film after many times of rewriting. Since the recombination probability of both the electric charges is large in the region, in which the electric charge density distributions of the electrons and the holes are overlapped with each other as shown in FIG. 31, and in the vicinity thereof, most of the electrons and holes vanish. However, in both end portions of the electric charge holding film where the recombination probability is small, the electrons and the holes locally remain. As described above, in the case of the both electric charge type MONOS memory, even when electrons are remaining, as long as the holes that cancel out the electric field thereof are present, it is, apparently, same as the state in which there is no remaining electron.

As a result, both the electric charges to be injected along with rewriting have to be injected in the amounts that cancel out the electric fields of the electric charges of the other side remaining in the film, and the injection amounts thereof inevitably increase as the number of rewriting increases. Furthermore, increase in the electric charge injection amounts along with rewriting is further accelerated by the characteristic deterioration of the memory transistor.

Hereinafter, increase in the electric charge injection amounts along with rewriting due to the characteristic deterioration of the memory transistor will be described.

FIG. 33 shows the relation between the memory gate voltage (Vmg) of the memory transistor and the drain current (Id) upon writing in comparison between the case of initial rewriting and the case after many times of rewriting (drain current is shown in logarithm). A solid line shows the characteristic after initial rewriting, and a broken line shows the characteristic after many times of rewriting. In the relation between the memory gate voltage and the drain current of the memory transistor in which rewriting has been performed many times, since the subthreshold coefficient (S value) is increased, writing cannot be performed until a predetermined threshold voltage even when the electrons equivalent to initial writing are injected. When they are compared by a write determination current of FIG. 33, this represents the result that the memory gate voltage is shifted to the left side. Thus, as a result, deterioration of the S value of the memory transistor which accompanies rewriting further accelerates increase in the electron injection amount. This is for the below reason.

An equivalent diagram of the memory transistor upon initial rewriting is shown in the upper right side, and an equivalent diagram after many times of rewriting is shown in the lower right side. Upon the initial rewriting, since the locally present amounts of both the electric charges in the electric charge holding film are small, it can be assumed as one transistor having a large threshold voltage (Vth). On the other hand, when locality in the presence of both the electric charges becomes significant, it can be assumed as two transistors disposed in series, i.e., a small transistor of a small Vth wherein holes are locally present and a transistor of a large Vth wherein electrons are locally present. When the transistor having the small Vth because of the locally present holes is caused to be in an ON state, the relation between the memory gate electrode and the drain current of the memory transistor is determined by the characteristic of the transistor of the large Vth wherein the electrons are locally present because of the effective channel length is small; therefore, the S value is increased. Therefore, in the memory transistor after many times of rewriting, the electric charge injection amount accompanying rewriting is increased. In other words, the increase in the electric charge injection amount accompanying rewriting is caused by the electric charge which is locally present in terms of space.

The phenomenon of the locally present both electric charges is strongly dependent on the injection temperature of both the electric charges, the higher the temperature of injection, the more the local presence can be suppressed. This is for the reason that the higher the temperature of injection, the more the electric charge distribution expands in terms of space, and the recombination efficiency is increased. However, this is not a realistic solution since this effect is exerted in a high-temperature state of 100° C. or more.

As described above, since the phenomenon of the local presence of both the electric charges in terms of space and energy leads to increase in the electric charge injection amount (time) along with a rewriting operation, deterioration of the film quality of the bottom Si oxide film is accelerated. Eventually, the deterioration of the film quality of the bottom Si oxide film significantly reduces the data holding characteristic (retention characteristic); therefore, the number of rewriting of the MONOS memory is limited.

An object of the present invention is to improve performance of a non-volatile semiconductor storage device which performs electron writing by hot electrons and hole erasure by hot holes, in particular, to improve the rewriting durability by suppressing increase in injection amounts of both electric charges accompanying rewriting. Also, another object of the present invention is to improve the rewriting durability by suppressing deterioration of the subthreshold coefficient. Also, another object is to improve the data holding characteristic.

The above described and other objects and novel characteristics of the present invention will be elucidated by the description of the present specification and appended drawings.

Summary of typical elements of the present invention disclosed in the present application will be simply described as the following.

A manufacturing method of a non-volatile semiconductor storage device according to the present invention is a manufacturing method of a non-volatile semiconductor storage device which writes information by injecting electrons into an electric charge holding film which holds electric charge and erases the information by injecting holes into the electric charge holding film, the method comprising (a) a step of forming a first potential barrier film on a semiconductor substrate; (b) a step of forming the electric charge holding film on the first potential barrier film; (c) a step of forming a second potential barrier film on the electric charge holding film; (d) a step of forming a electric conductor film on the second potential barrier film; (e) a step of subjecting the first potential barrier film, the electric charge holding film, the second potential barrier film, and the electric conductor film to patterning; and (f) a step of forming first and second semiconductor regions in the semiconductor substrate; wherein the electric charge holding film has an Si nitride film (SRN film) stoichiometrically excessively containing silicon.

A desired mode of the Si nitride film (SRN film) stoichiometrically excessively containing silicon (Si) is an Si nitride film which is formed by physical vapor deposition (PVD) or chemical vapor deposition and excessively contains Si in a range that exceeds composition variation of an $Si_3N_4$ film.

One specific mode of the SRN film is an Si nitride film which is formed by thermal CVD in which dichlorosilane ($SiH_2Cl_2$) and ammonia ($NH_3$) are used as raw material gases and excessively contains Si in a range that exceeds composition variation of $Si_3N_4$ film.

Another specific mode of the SRN film is an Si nitride film which is formed by thermal CVD in which monosilane ($SiH_4$) and ammonia ($NH_3$) are used as raw material gases and excessively contains Si in a range that exceeds composition variation of the $Si_3N_4$ film.

Effects obtained by typical elements of the invention disclosed in the present application will be simply described as the following.

Performance of a non-volatile semiconductor storage device which performs electron writing by hot electrons and hole erasure by hot holes can be improved. Particularly, rewriting durability can be improved by suppressing increase in the both electric charge injection amount accompanying rewriting. In other words, by suppressing deterioration of the subthreshold coefficient, the rewriting durability can be improved, and the data holding characteristic can be improved.

DESCRIPTION OF THE PREFERRED EMBODIMENTS

A basic idea of the present invention will be described before explaining specific embodiments of the present invention. The basic idea of the present invention is to suppress local presence of both electric charges by increasing the recombination probability of electrons and holes injected into an electric charge holding film. In other words, it is to provide the electric charge holding film which can solve the problems due to the difference between the injection positions of both the electric charges in terms of energy and between the injection positions in terms of space. Specifically, the above described problems can be solved by applying an SRN film to at least part of the electric charge holding film.

However, as described above, the advantages of using the SRN film are limited to a MONOS memory of a both electric charge injection type. The reason will be described below.

Figure 34:
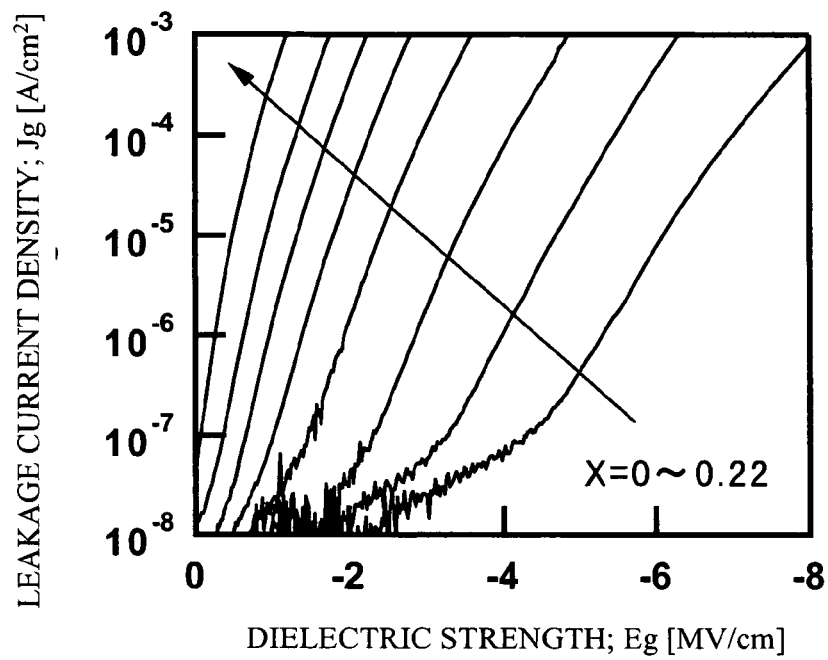
FIG. 34 is a graph showing the relation between dielectric strength and leakage currents of SRN films having different compositions.
Figure 35:
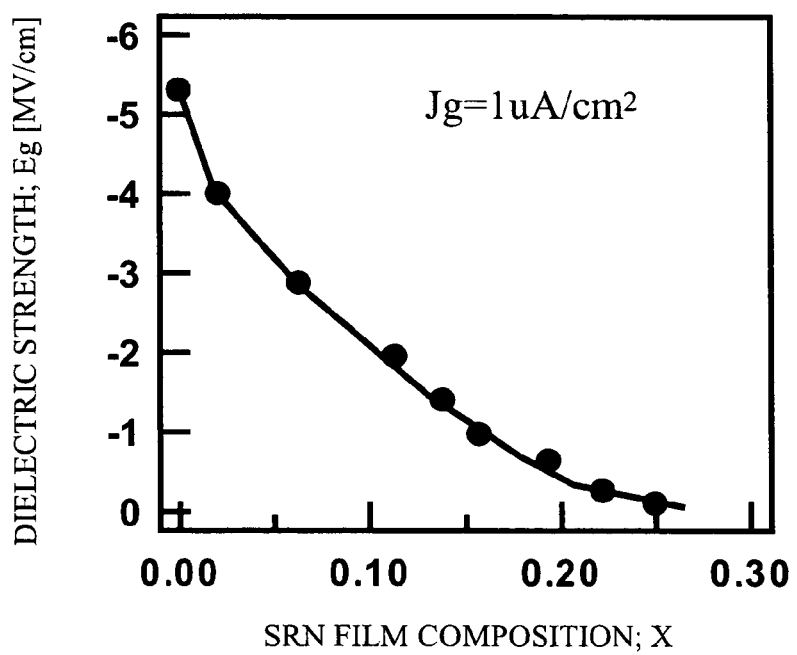
FIG. 35 is a graph showing the relation between the dielectric strength of the SRN films and the compositions of the SRN films.

FIG. 34 shows an electric field (Eg)-current density (Jg) characteristic of a MIS (Metal Insulator Semiconductor) capacitor which uses the SRN film formed on a p-type Si substrate as an insulating film. Also, the relation between the dielectric strength defined by the current density of FIG. 34 which is Jg=1 $\mu A/cm^2$ and the SRN film composition is shown in FIG. 35. In both the drawings, comparison is made by using the composition of the SRN film, which is an insulating film, as a parameter. Herein, the composition x of the SRN film is defined as the following.

The SRN film is assumed to be composed of a mixed film of Si and $Si_3N_4$ films and is represented by the composition $x=Si/(Si+Si_3N_4)$. Thus, when x=0, it is an $Si_3N_4$ film stoichiometrically, and x=1 corresponds to an Si film. Also, when x is larger than 0, it represents an $Si_3N_4$ film which stoichiometrically excessively contains Si.

As is clear from both the drawings, merely by slightly increasing the composition x, the leakage current of the SRN film is significantly increased compared with the $Si_3N_4$ film. This indicates that Si—Si bonds in the SRN film is increased, and the mobility of the carriers therein is significantly increased compared with the $Si_3N_4$ film. In other words, although the trap level of the carriers due to Si—Si bonds is increased in the SRN film compared with the $Si_3N_4$ film, the electric charge holding ability is reduced. Therefore, when it is applied to a single electric charge type (FN injection/FN erasure method) MONOS memory which uses an extremely thin tunnel Si oxide film (about 2 nm) as an potential barrier film, the data holding characteristic is significantly deteriorated. The deterioration of the data holding characteristic can be suppressed when the thickness of the tunnel Si oxide film is increased to 4 nm or more; however, it is difficult to apply in reality, since writing/erasure speeds are significantly reduced in the FN injection/FN erasure method.

On the other hand, in a both electric charge injection type MONOS memory, since carriers having large energy are injected, high-speed rewriting can be performed even when the thickness of the bottom Si oxide film positioned in a layer below the electric charge holding film is increased. Therefore, when the SRN film is used in an appropriate condition range, the local presence of both the electric charges can be suppressed without causing deterioration of the data holding characteristics. Hereinafter, the reasons that the local presence of both the electric charges can be suppressed will be described.

Figure 31:
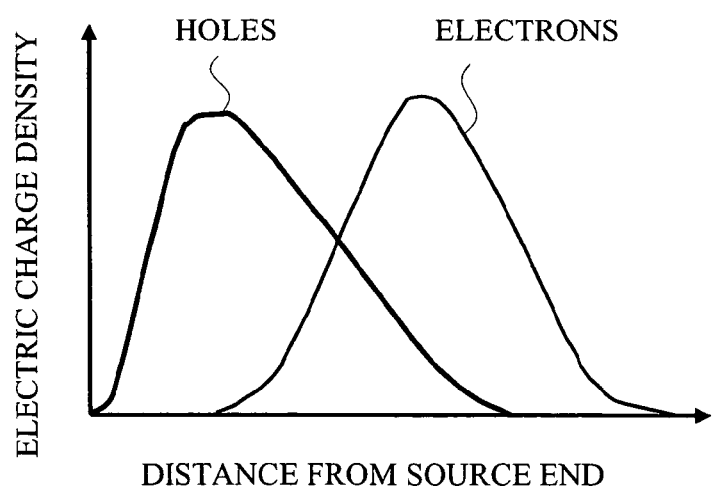
FIG. 31 is a diagram showing captured distributions of the electrons and holes in an electric charge holding film in the non-volatile memory that the present inventors have studied.
Figure 32:
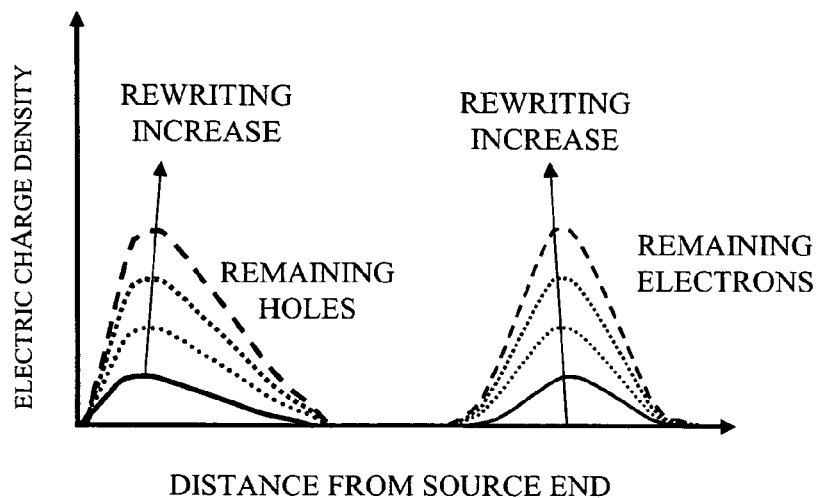
FIG. 32 is a diagram showing distributions of the electrons and holes in the electric charge holding film along with rewriting in the non-volatile memory that the present inventors have studied.
Figure 33:
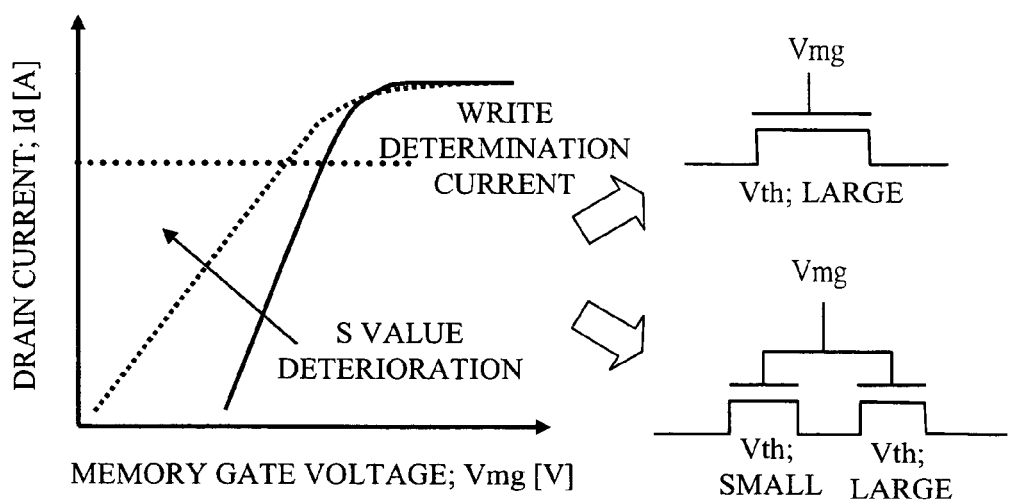
FIG. 33 is a diagram showing deterioration of the subthreshold value along with rewriting in the non-volatile memory that the present inventors have studied.
Figure 36:
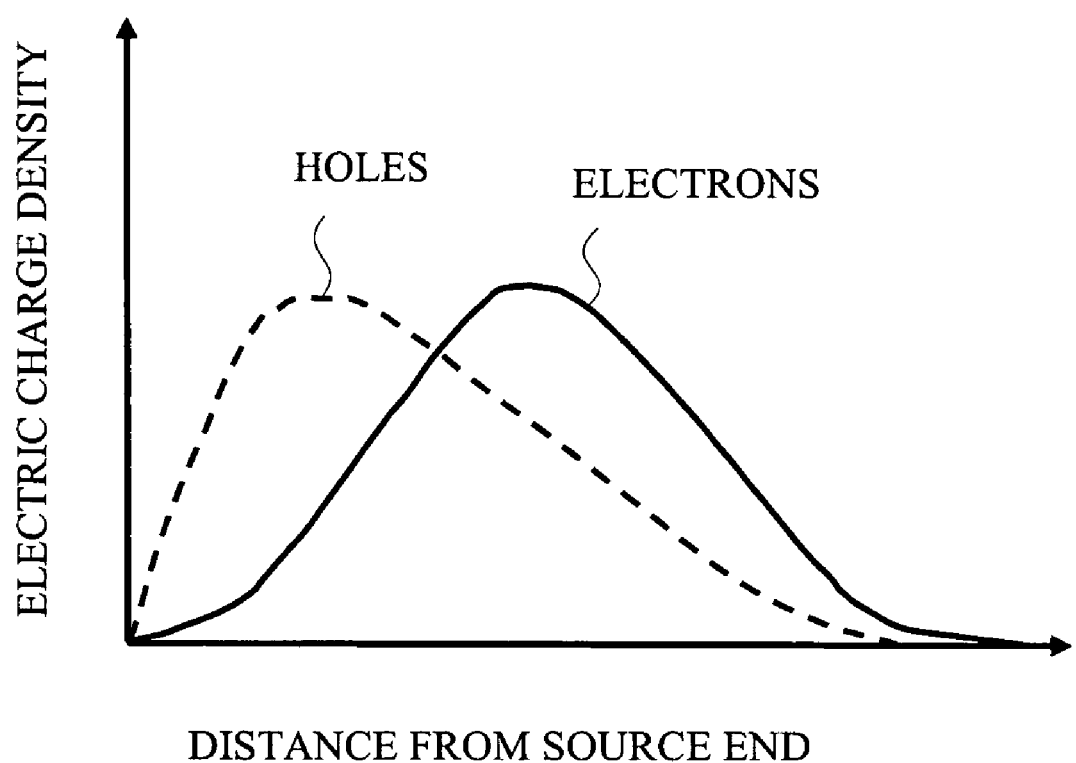
FIG. 36 is a diagram showing distributions of electrons and holes captured in an electric charge holding film in a non-volatile memory of the present invention.

In the both electric charge injection type MONOS memory, the electrons and the holes injected into local regions in the electric charge holding film generate self-electric fields; therefore, the spatial distributions thereof are slightly expanded than the injected distributions. The expansion of the spatial distributions of the electric charges is largely dependent on the mobility of the electric charges in the electric charge holding film. As described above, the mobility of electric charges in the SRN film is higher than the $Si_3N_4$ film. Therefore, as shown in FIG. 36, the electric charge captured distributions upon writing/erasure are wider than in the $Si_3N_4$ film, and the recombination probability of the electrons and holes is increased (see FIG. 31 in comparison). By virtue of this increase in the recombination probability, the local presence of both the electric charges can be suppressed.

However, even in the both electric charge injection type MONOS memory, other problems occur when Si is too excessive in the composition of the SRN film since the dielectric strength of the SRN film is significantly deteriorated (significant increase in the leakage current).

One of the specific examples is a phenomenon in which the hot electrons injected from the Si substrate side leak to the memory gate electrode side during a writing operation and a phenomenon in which electrons flow in from the memory gate electrode side during hot hole injection (during erasure operation). Therefore, even when the writing/erasure operation is performed, a problem that writing/erasure cannot be performed until a predetermined threshold voltage occurs. This problem can be avoided to some extent by increasing the thickness of the bottom Si oxide film and the top Si oxide film. However, since the thickness of the capacitance insulating film of the memory transistor is increased, performance deterioration as the MONOS memory such as decrease in the reading speed and increase in the writing/erasure time is also caused.

Another one of the specific examples is deterioration of the data holding characteristic. When Si in the composition of the SRN film is excessively increased, carriers can move in the SRN film freely to some extent, and a defect that carriers leak from pinhole portions of the bottom Si oxide film or the top Si oxide film become prominent. According to the study carried out by the present inventors, as is clear from FIG. 35, when the composition x of the SRN film exceeds 0.25, the electrical behavior of the SRN film becomes equivalent to that of the Si film, and the data holding characteristic is significantly deteriorated. Therefore, in order to ensure the data holding characteristic, the composition x of the SRN film is desired to be in a range which does not exceed 0.25.

Specific embodiments will next be described. The below embodiments will be described separately in a plurality of sections or embodiments in accordance with needs for the sake of convenience. However, unless otherwise particularly stated, they are not irrelevant, but they are related to each other so that one of them is a part or a whole embodiment, detail, supplemental explanation, etc. of the other.

In the below embodiments, when numbers or the like of elements (including numbers, numerical values, amounts, ranges, etc.) are mentioned, except for, for example, the case in which it is particularly stated and the case in which they are apparently limited to the particular numbers, they are not limited to the particular numbers but may be equal, more than, or less than the particular numbers.

Furthermore, it goes without saying that, in the below embodiments, the constituent elements (including elemental steps and the like) are not necessarily essential except for, for example, the case in which it is particularly stated and the case in which they are apparently conceived to be essential.

Similarly, in the below embodiments, when the shapes, positional relations, etc. of the constituent elements, etc. are mentioned, those practically close to or similar to the shapes, etc. thereof are included except for, for example, the case in which it is particularly stated and the case in which it is apparently conceived not to be included. This is also the same for the above described numerical values and ranges.

Moreover, in all the drawings for explaining the embodiments, same members are denoted by same reference numerals, and repetitive descriptions thereof will be omitted.

First Embodiment

Figures 1, 2, 3:
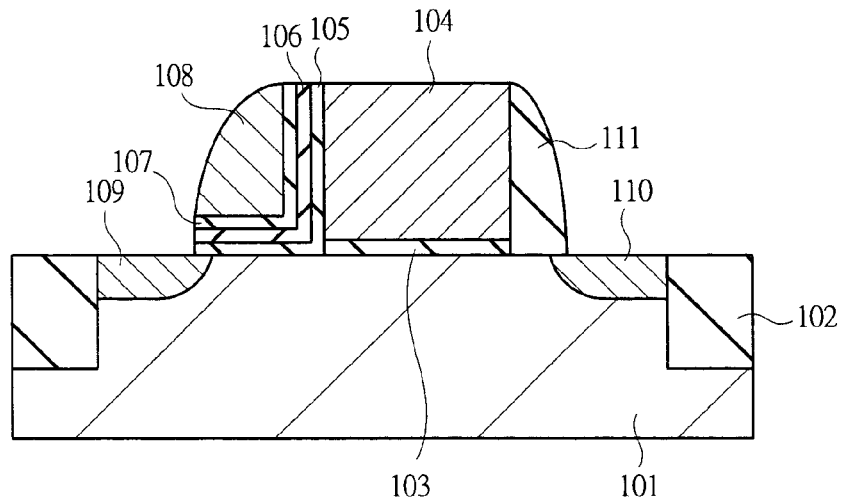
FIG. 1 is a cross sectional view of a substantial part of a non-volatile memory which is a first embodiment of the present invention.
FIG. 2 is a table showing refractive index characteristics of electric charge holding films having different compositions.
FIG. 3 is a table showing examples of operation conditions of the non-volatile memory in the first embodiment.

A first embodiment of the present invention will be described in detail by using FIG. 1 to FIG. 14. FIG. 1 is a diagram showing a cross sectional view of a non-volatile memory cell which is the first embodiment of the present invention. In practice, wiring is present in an upper layer of the drawing; however, it is omitted in this drawing. FIG. 2 shows samples fabricated in the first embodiment. The first embodiment provides examples in which, as shown in FIG. 2, as an electric charge holding film, a sample A using a film having a stoichiometrical ratio of $Si_3N_4$, a sample B using an SRN film into which silicon atoms (Si) are stoichiometrically excessively introduced, and a sample C using an SRN film into which silicon atoms (Si) are stoichiometrically excessively introduced are fabricated. The SRN film compositions of the sample B and the sample C are different, and the SRN film of the sample C further excessively contains Si. In the first embodiment, except for the electric holding film, all the film configurations and manufacturing processes of the samples A to C are the same. In other words, all the non-volatile memory cells corresponding to the samples A to C have the configuration shown in FIG. 1, and merely the composition of the electric charge holding film is different. As is understood from FIG. 2, the refractive index of the stoichiometrically $Si_3N_4$ film (sample A) is about 2, and it can be understood that the larger the ratio of stoichiometrically excessively contained silicon (the larger x), the larger the refractive index. Therefore, the compositions of the electric charge holding films can be specified by measuring the refractive indexes thereof. As a measurement method of the refractive index, for example, ellipsometry can be used to carry out the measurement. The refractive indexes shown in FIG. 2 are measured by using ellipsometry, wherein a He—Ne laser (wavelength of 633 nm) is used. The composition x of the electric charge holding film can be specified by measuring the refractive index in this manner. The composition x is based on the definition described at the beginning of the section of the detailed description of the present invention.

The non-volatile memory cell is composed of two field effect transistors having a p-type well region 101, an isolation region 102, an n-type diffusion layer (n-type semiconductor region) serving as a source region 109, and an n-type diffusion layer (n-type semiconductor region) serving as a drain region 110 provided on an Si substrate (semiconductor substrate). Note that the names of the source region and the drain region in the first embodiment represent a voltage relation upon a reading operation, and the names may be the opposite names.

The selective transistor is composed of an Si oxide film serving as a gate insulating film 103 and an n-type polycrystalline Si film serving as a control gate electrode (first electric conductor) 104. A memory gate electrode 108 of the memory transistor is formed in a left-side side wall portion of the control gate electrode 104 of the selective transistor in a self-aligned manner. On the other hand, in a right-side side wall portion of the control gate electrode 104, a sidewall 111 is formed. In the first embodiment, for example, the gate length of the selective transistor is about 150 nm, and the gate length of the memory transistor is about 55 nm.

The memory transistor is composed of a bottom Si oxide film 105 serving as a lower layer potential barrier film (first potential barrier film) above the p-type well region 101, the electric charge holding film 106, a top Si oxide film 107 serving as an upper layer potential barrier film (second potential barrier film), and the memory gate electrode (second electric conductor) 108 composed of an n-type polycrystalline Si film. The above described bottom Si oxide film 105, the electric charge holding film 106, and the top Si oxide film 107 are capacitance insulating films of the memory transistor and also serve as side wall insulating films which electrically separate the control gate electrode 104 from the memory gate electrode 108.

Initial threshold voltages (Vth) of the selective transistor and the memory transistor are adjusted to about 1 V and about 0 V, respectively, by performing impurity implantation into a surface region of the p-type well 101 in which a channel is formed.

The gate insulating film 103 of the selective transistor and the bottom Si oxide film 105 of the memory transistor are, for example, Si oxide films formed by thermally oxidizing the p-type well region 101 in an oxidizing atmosphere and, for example, have thicknesses of 3 nm and 4 nm, respectively. In the first embodiment, an example in which thermally oxidized films are employed as the gate insulating film 103 of the selective transistor and the bottom Si oxide film 105 of the memory transistor is shown. However, Si oxynitride films obtained by treating (nitriding treatment) thermally oxidized films in a nitriding atmosphere such as an atmosphere of nitrogen monoxide (NO) or nitrous oxide ($N_2O$) can be also used.

The $Si_3N_4$ film (sample A) which is the electric charge holding film 106 and the SRN films (samples B and C) may be deposited films formed by LP-CVD (Low Pressure-Chemical Vapor Deposition) method using, for example, monosilane ($SiH_4$) and ammonia ($NH_3$) as raw material gases. For example, the formation temperature is 700° C., a total pressure is 100 Pa, and the film thickness is 14 nm. Herein, a single wafer CVD apparatus is used in formation of the electric charge holding film 106, and the composition x is adjusted by controlling the gas flow rate ratio ($NH_3/SiH_4$). Note that, although the CVD method using monosilane ($SiH_4$) and ammonia ($NH_3$) as raw materials in formation of the electric charge holding film 106 is employed, the method is not limited thereto, and, for example, it can be formed by a CVD method using dichlorosilane ($SiH_2Cl_2$) and ammonia ($NH_3$) as raw materials.

The top Si oxide film 107 of the memory transistor is an Si oxide film obtained by, for example, subjecting the electric charge holding film 106 to steam oxidation and has a thickness of, for example, about 6 nm. In the formation process of the top Si oxide film 107, the surface of the electric charge holding film 106 is oxidized, and the film thickness thereof is reduced to about 10 nm. Although the example in which steam oxidation is employed in the formation of the top Si oxide film 107 is shown, oxidation using ozone or oxidation using radical can be also employed. Also, the Si oxide film may be deposited by a low-pressure CVD method using dichlorosilane ($SiH_2Cl_2$) and nitrous oxide ($N_2O$) as raw material gases. However, when the top Si oxide film 107 is formed by the CVD method, the thickness of the electric charge holding film 106 is not reduced; therefore, the electric charge holding film 106 has to be set thin in advance. Note that the element dimensions and absolute values of the thickness of the thin films shown in the first embodiment are examples, and the present invention is not limited by these numerical values.

In the first embodiment, as the formation method of the SRN film which is the electric charge holding film 106, the example of the thermal CVD method which uses monosilane ($SiH_4$) and ammonia ($NH_3$) as raw materials is shown. However, the first embodiment is not limited by the types of the raw material gases, and, as the supply source (Si compound) of Si, a hydrogen Si compound such as monosilane ($SiH_4$), disilane ($Si_2H_6$), or dichlorosilane ($SiH_2Cl_2$), or a halogen Si compound such as silicon tetrachloride ($SiCL_4$) or silicon hexachloride can be used. Also, as a supply source of nitrogen, for example, hydrazine ($N_2H_2$) can be certainly used other than ammonia ($NH_3$). As the film formation method thereof, another CVD method such as a plasma CVD method or a catalytic CVD method can be employed. Also, the SRN film may be formed by employing sputtering (PVD method). For example, a method in which Si is used as a target, and sputtering is performed in a nitriding atmosphere, thereby forming the SRN film can be employed.

FIG. 3 shows operations of the non-volatile memory cell shown in FIG. 1 and examples of applied voltages. Herein, electron injection into the electric charge holding film 106 is defined as write (Write), and hole injection thereto is defined as erasure (Erase). The write is hot electron injection from the selective transistor side, and the erasure is injection of hot holes generated by band-to-band tunneling (BTBT) at a source region end.

The symbols of FIG. 3 represent the voltages applied to respective electrodes, and Vmg represents the voltage applied to the memory gate electrode 108 of the memory transistor. Also, Vs represents the voltage applied to the source region 109, and Vd represents the voltage applied to the drain region 110. Furthermore, Vcg represents the voltage applied to the control gate electrode 104 of the selective transistor, and Vsub represents the voltage applied to the p-type well 101.

In a write operation, for example, Vmg=12V, Vs=5V, Vd=1 V, Vcg=1.5V, and Vsub=0V, and these potentials are applied as pulses, for example, for one microsecond. An extremely large electric field is applied to the surface of the p-type well 101 that is immediately below an extremely narrow region electrically insulating the selective transistor from the memory transistor. Channel electrons accelerated by this electric field are caused to be hot electrons having energy larger than that of the barrier potential of the bottom Si oxide film 105, and part of them is drawn into the memory gate electrode 108 side across the bottom Si oxide film and injected into the electric charge holding film 106 by the large electric field of the memory gate electrode 108. Thus, the writing operation is carried out.

In an erasure operation, for example, Vmg=−6V, Vs=6V, Vd=1.5V, Vcg=0V, and Vsub=0V, and these potentials are applied as pulses, for example, for 100 microseconds. In an end of the source region 109, band-to-band tunneling occurs because of an extremely large electric field, and hot holes having energy larger than the barrier potential of the bottom Si oxide film 105 are generated. Part of the hot holes is drawn into the memory gate electrode 108 side across the bottom Si oxide film and injected into the electric charge holding film 106 by the large electric field of the memory gate electrode 108. Thus, the erasure operation is carried out.

In a read operation, for example, Vmg=−5V to 7V, Vs=0V, Vd=1V, Vcg=1.5V, and Vsub=0V. More specifically, the selective transistor is caused to be in an on state, and an potential between a threshold value of the write state and a threshold value of the erasure state is applied to the memory gate electrode 108 of the memory transistor. Consequently, the memory cell into which electrons have been injected maintains an off state, while the memory cell into which holes have been injected is caused to be an on state; thus, binary information can be read.

Note that the voltage conditions shown in FIG. 3 are examples, and the present invention is not limited by these numerical values.

Next, results that write characteristics and erasure characteristics are compared between the sample A in which the electrical charge holding film 106 is composed of stoichiometrically $Si_3N_4$ film and the samples B and C in which the electric charge holding film 106 stoichiometrically excessively contains Si will be described.

Figure 4:
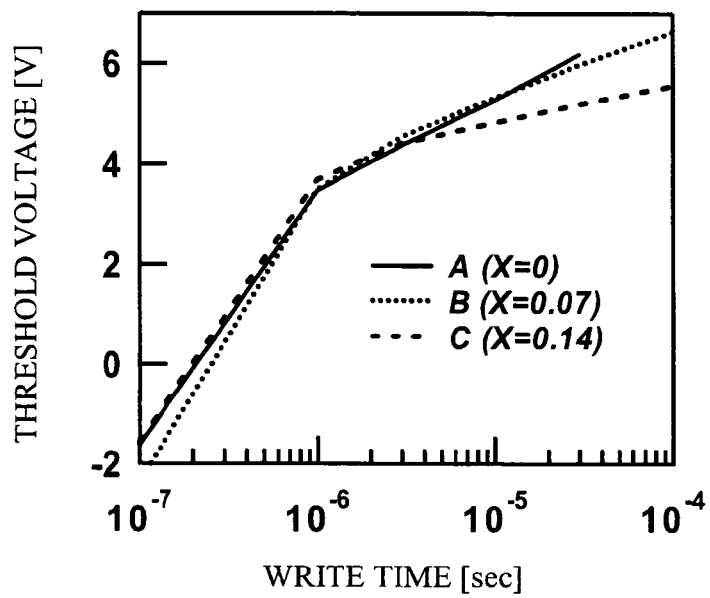
FIG. 4 is a graph showing comparison of write characteristics in the first embodiment.
Figure 5:
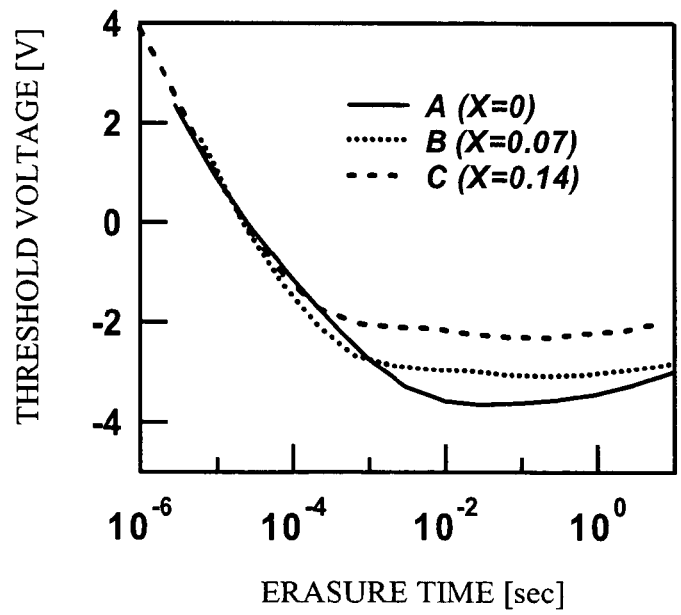
FIG. 5 is a graph showing comparison of erasure characteristics in the first embodiment.

FIG. 4 is a graph in which the write characteristics are compared, and FIG. 5 is a graph in which the erasure characteristics are compared. In FIG. 4, the horizontal axis indicates write time (sec), and the vertical axis indicates a threshold value voltage. As shown in FIG. 4, since electrons are injected into the electric charge holding film 106 as the write time elapses, it can be understood that the threshold value voltage of the non-volatile memory is increased. On the other hand, in FIG. 5, the horizontal axis indicates erasure time (sec), and the vertical axis indicates a threshold value voltage. As shown in FIG. 5, since holes are injected into the electric charge holding film 106 as the erasure time elapses, it can be understood that the threshold value voltage of the non-volatile memory is lowered.

Measurement of both the characteristics is carried out after subjecting the samples, which have not undergone rewriting, to ten times of verification writing. As the threshold voltage (Vth) of the verification writing, the threshold value voltage in the writing side is 5 V (Vth=5V), and the threshold value voltage in the erasure side is −2 V (Vth=−2V). In other words, the writing characteristics are the writing characteristics from initial Vth of −2 V, and the erasure characteristics are erasure characteristics from the initial Vth of 5 V. Hereinafter, the initial Vth (writing depth) in the writing side will be described as PV, and the initial Vth (erasure depth) in the erasure side will be described as EV.

As shown in FIG. 4, when the writing characteristics are compared, the $Si_3N_4$ film of the sample A and the SRN film of the sample B having the composition of x=0.07 show equivalent writing characteristics; meanwhile, the SRN film of the sample C having the composition of x=0.14 shows decrease in the writing speed from approximately when the threshold voltage is about 4.5 V. On the other hand, as shown in FIG. 5, when the erasure characteristics are compared, it can be understood that the $Si_3N_4$ film (sample A) can perform erasure to a deepest level, and the erasure levels is lowered along with increases of the composition x of the SRN film. This is for the below reason.

Figure 6:
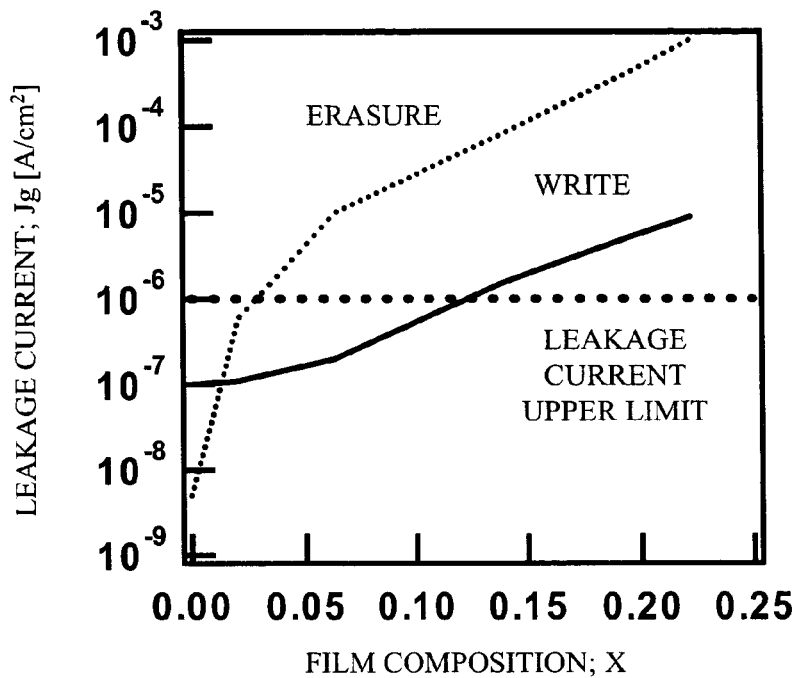
FIG. 6 is a graph showing the relation between the compositions of an SRN film and leakage currents of a MONOS capacitor.

FIG. 6 is a diagram showing the relation between leakage currents of a MONOS capacitor fabricated on a p-type substrate and the composition x of an electric charge holding film. In FIG. 6, the horizontal axis indicates the composition x of the electric charge holding film, and the vertical axis indicates the leakage current. A capacitor insulating film (ONO film) is composed of a bottom Si oxide film (4 nm)/an electric charge holding film (10 nm)/a top Si oxide film (6 nm). The solid line shows a leakage current density upon a writing voltage application, and a broken line shows a leakage current density upon erasure voltage application, wherein the leakage currents at the point when 100 microseconds have elapsed after application of the voltages are shown. As is clear from FIG. 6, when the composition of the electric charge holding film, i.e., the composition x of the SRN film is increased (Si is made excessive), the leakage current increases. It can be understood that the leakage current upon the erasure operation is particularly increased. When the writing/erasure characteristics are examined in detail at each film composition, the phenomenon that, regarding the leakage current density of the ONO film, the saturation phenomenon of the writing level or the erasure level become shallow once it reaches about 1 $\mu A/cm^2$ is observed. The reason for this phenomenon will be described by using FIG. 7.

Figure 7:
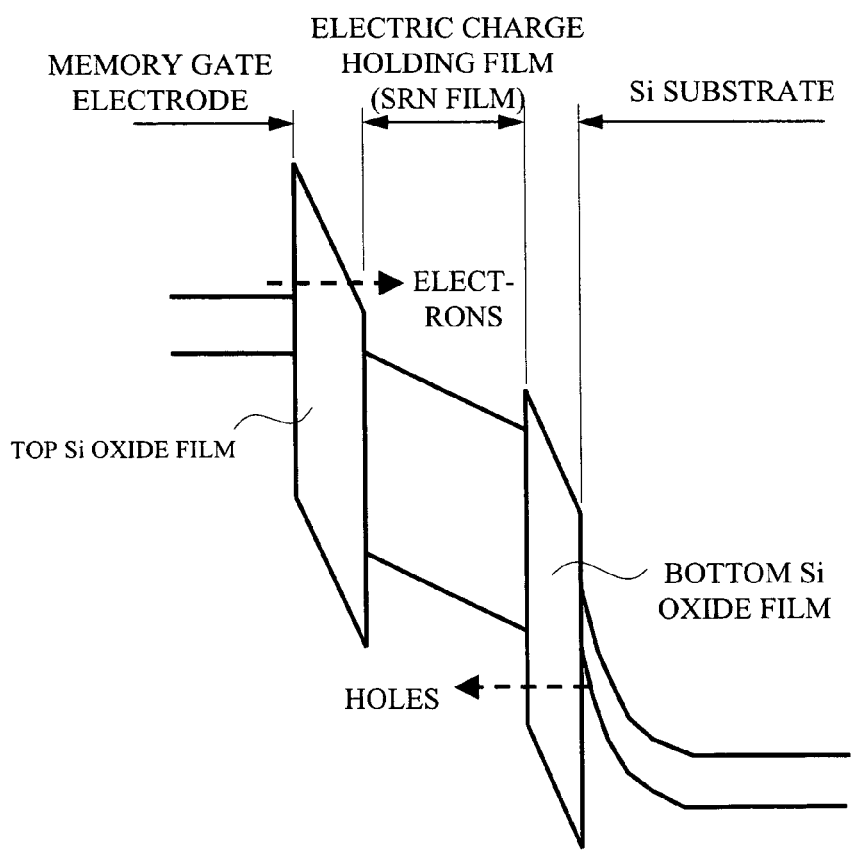
FIG. 7 is a diagram showing a band diagram of the non-volatile memory when an erasure voltage is applied.

FIG. 7 is a schematic diagram of a band diagram when a certain period of time elapsed after an erasure operation. When erasure is started, electrons from the memory gate electrode side are not readily injected since electrons are captured in the SRN film which is the electric charge holding film (SRN film region has an upwardly convex band structure); however, when the electrons are erased by hole injection, the electric field applied to the top Si oxide film is increased, and the amount of electrons injected from the memory gate electrode side is increased. Since these electrons are recombined with the holes injected from the Si substrate side, the electrons captured by the SRN film are not sufficiently erased, thereby causing the phenomenon that the threshold voltage upon erasure becomes shallow. Although explanation upon erasure is given herein, the phenomenon upon writing is similar, wherein, a the same time when electrons are written, electrons leak to the top Si oxide film side, thus a saturation phenomenon of the writing voltage occurs.

Therefore, when the SRN film is used as the electric charge holding film, the composition is preferred to be selected within the range that the leakage current is not increased by the writing and erasure operations. Furthermore, when the top Si oxide film is set to be slightly thick, and FN leakage of the electrons is suppressed, the composition range that the SRN film can be used can be expanded.

Figure 8:
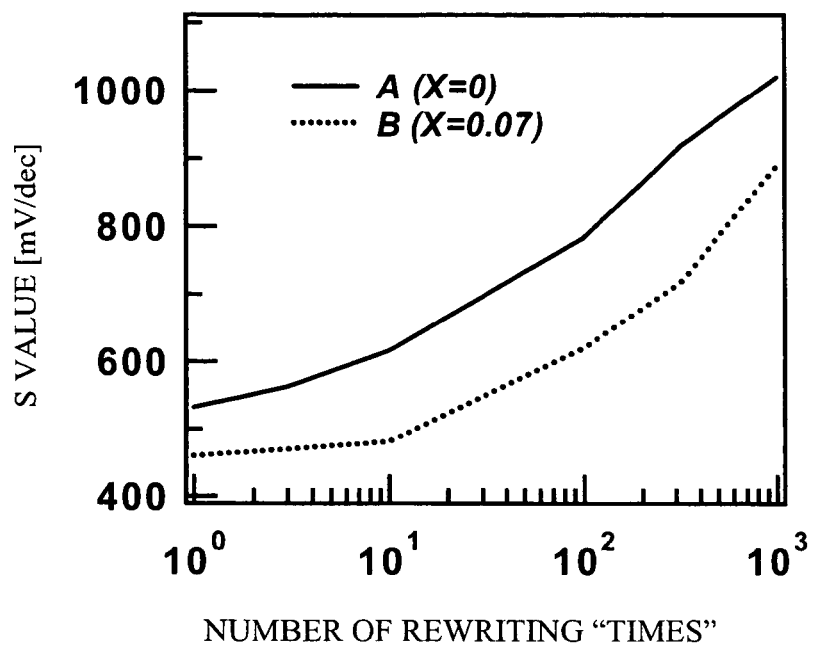
FIG. 8 is a graph showing the relation between the number of rewriting and a subthreshold coefficient.
Figure 9:
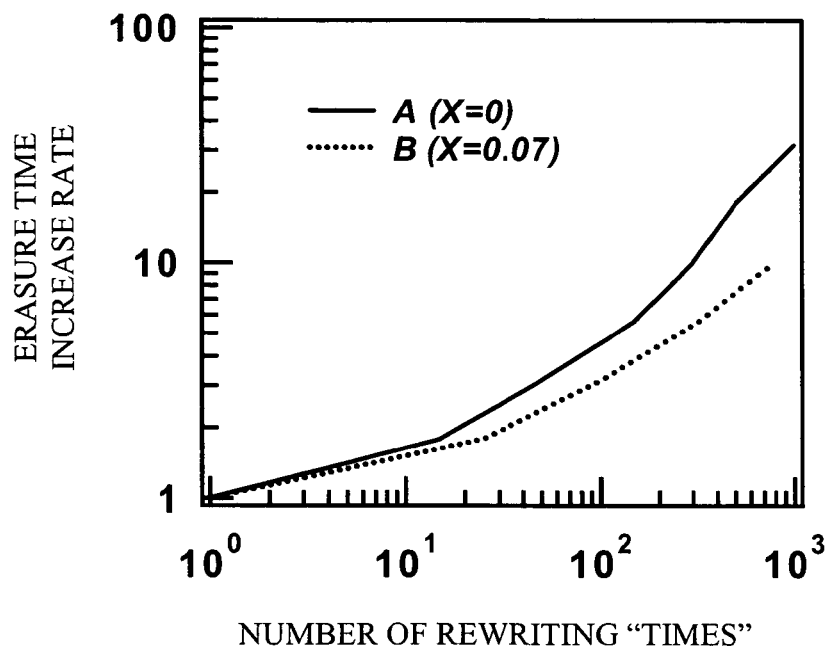
FIG. 9 is a graph showing the relation between the number of rewriting and an erasure time increase rate.

Next, rewriting durability which is the most characteristic in the present invention will be described. FIG. 8 is a diagram showing comparison of the number of rewriting against variation in the subthreshold coefficient (S value), and FIG. 9 is a diagram showing the increase rate of erasure time. Herein, the sample A ($Si_3N_4$ film) and the sample B (SRN film, x=0.07)

to which write/erasure can be normally performed are compared. Note that, verification writing is performed so that PV=5 and EV=−1V in rewriting. The erasure time increase rate of FIG. 9 is shown as a ratio of erasure time of a first time and erasure time of n-th time. As is clear from both the diagrams, the variation amount in the S value is smaller and the erasure time increase rate is also smaller in the sample B using the SRN film compared with the sample A using the $Si_3N_4$ film. Conceivably, this is for the reason that local presence of the electrons and holes accompanying rewriting is suppressed in the SRN film compared with the $Si_3N_4$ film. More specifically, when the SRN film stoichiometrically excessively containing silicon is used as the electric charge holding film of the non-volatile memory instead of the stoichiometrically $Si_3N_4$ film, the mobility of the electrons and holes in the electric charge holding film is increased, thus, the local-presence phenomenon of the electrons and the holes can be mitigated. When the local-presence phenomenon of the electrons and the holes can be mitigated, the recombination probability of the electrons and the holes can be increased, and the amounts of the electric charges that remain in the electric charge holding film can be reduced even when rewriting is performed for many times. Therefore, for example upon an erasure operation, since the amount of the electrons that remain in the electric charge holding film is small, the injection amount of the holes to be recombined with the remaining electrons can be also reduced. Thus, increase in the erasure time can be suppressed even when rewriting is performed for many times. Moreover, since the amount of electric charge locally remaining in the electric charge holding film can be reduced, deterioration of the S value can be also prevented.

Subsequently, data holding characteristics will be described.

Figure 10:
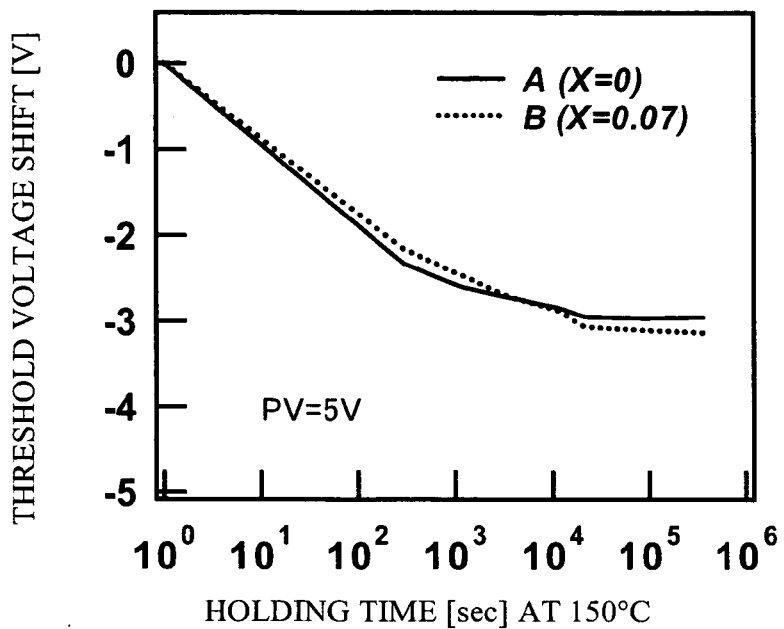
FIG. 10 is a graph showing data holding characteristics upon write.
Figure 11:
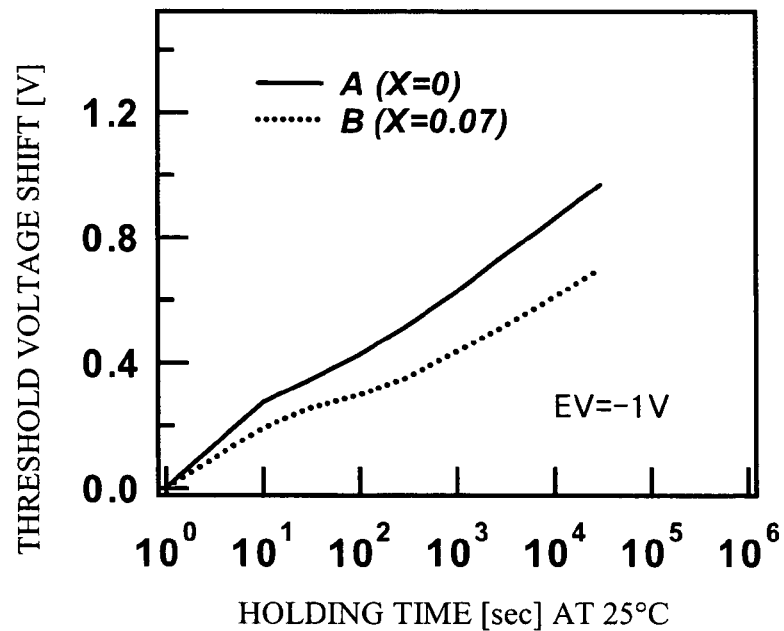
FIG. 11 is a graph showing data holding characteristics upon erasure.

FIG. 10 and FIG. 11 show comparison of data holding characteristics. FIG. 10 shows the data holding characteristic on the write side (PV=5V), and FIG. 11 shows the data holding characteristic of the erasure side (EV=−1V), wherein both of them are plotted by voltage variation amounts from the beginning. The data holding characteristic of the write side of FIG. 10 shows results at no voltage and 150° C., and the data holding characteristic of the erasure side of FIG. 11 shows results of application of Vmg=1.5V (bias acceleration retention) at 25° C.

As shown in FIG. 10, when time elapses after a write operation is performed, the threshold value voltage of the memory transistor is reduced from a predetermined value; however, there is no significant difference between the $Si_3N_4$ film and the SRN film in the write side characteristics. On the other hand, as shown in FIG. 11, when time elapses after an erasure operation is performed, the threshold voltages of the memory transistor increase from a predetermined value, wherein the SRN film shows a better characteristic in the erasure side characteristics. The increase in the threshold value voltage in the erasure side is caused since electrons flow into the electric charge holding film from the strongly-inverted Si substrate side of the memory transistor via the bottom Si oxide film. Conceivably, a main cause for this is injection of electrons via a trap level generated by rewriting in the bottom Si oxide film. Therefore, when the SRN film is used, increase in the hole injection amount required for erasure can be suppressed, and, as a result, deterioration of the bottom Si oxide film does not readily occur. In other words, since increase in the hole injection amount required for erasure can be suppressed by using the SRN film, generation of the trap level which is caused when holes pass through the bottom Si oxide film can be reduced, and injection of electrons into the electric charge holding film can be suppressed. Thus, the erasure side holding characteristic is improved.

As described above, when the SRN film having a stoichiometrically large Si composition in the range that the leakage current is not increased in the write and erasure operations is used as the electric charge holding film, the both electric charge injection type MONOS memory excellent in the rewriting durability can be realized. Thus, according to the first embodiment, performance of the non-volatile semiconductor storage device which performs electron writing by hot electrons and hole erasure by hot holes can be improved. Particularly, the rewriting durability can be improved by suppressing increase in the both electric charge injection amounts accompanying rewriting. In other words, by suppressing deterioration of the subthreshold coefficient, the rewriting durability can be improved, and, furthermore, the data holding characteristic can be improved.

Figure 12:
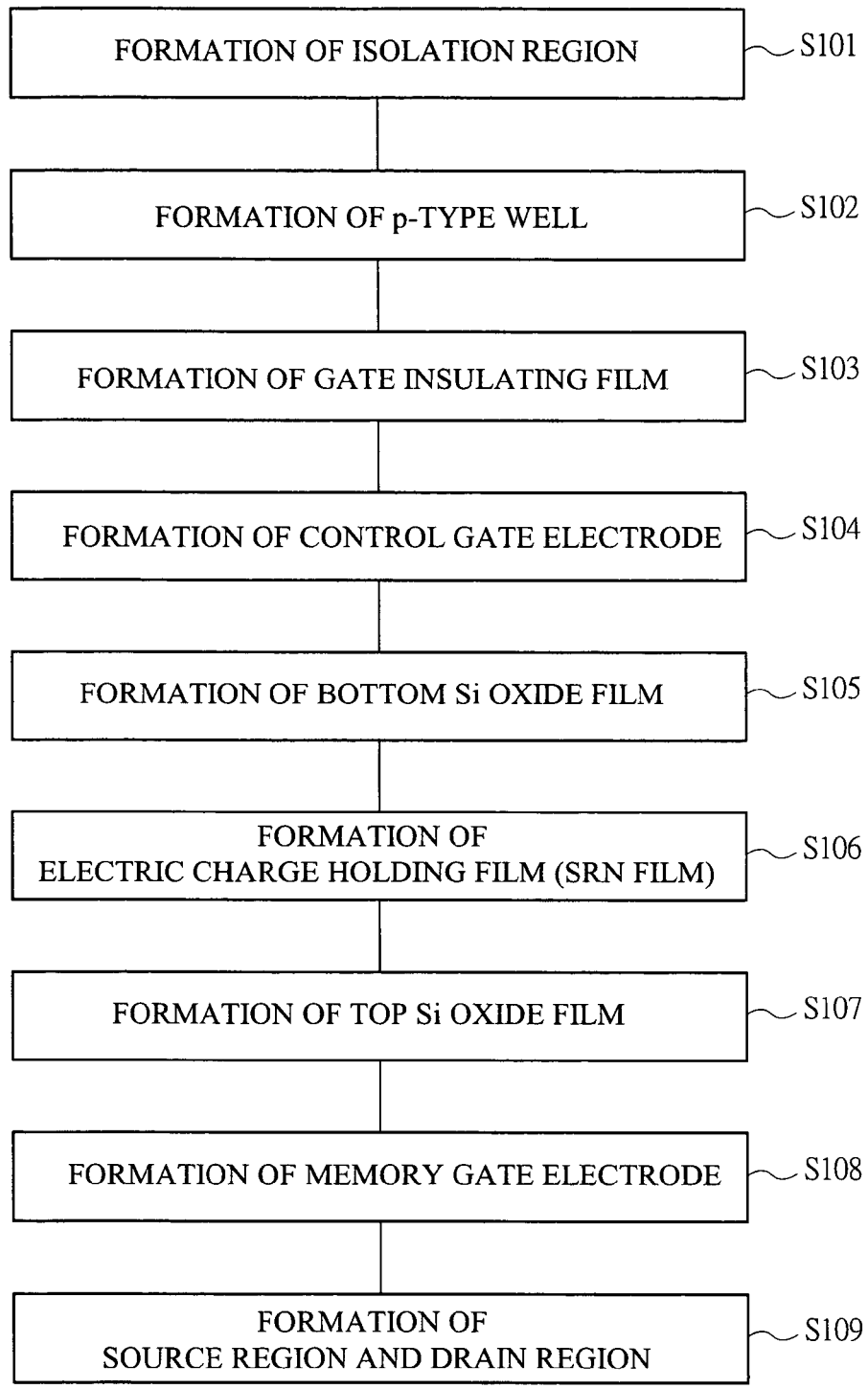
FIG. 12 is a flow chart showing a manufacturing process of the non-volatile memory in the first embodiment.

Next, a manufacturing method of the non-volatile memory in the first embodiment will be described. FIG. 12 is a flow chart showing a manufacturing process of the non-volatile memory in the first embodiment. The manufacturing process will be described based on the flow chart.

First of all, isolation regions for isolating elements are formed on an Si substrate (semiconductor substrate) (S101). The isolation regions can be formed by STI (Shallow Trench Isolation) in which, for example, a trench is formed in the Si substrate, an Si oxide film is formed on the Si substrate including the interior of the trench, and then the Si oxide film is caused to remain merely in the trench by employing chemical mechanical polishing (CMP: Chemical Mechanical Polishing).

Subsequently, by employing a photolithography technique and ion implantation, a p-type well is formed in an active region between the isolation regions (S102). The p-type well is formed, for example, by introducing a p-type impurity such as boron into the Si substrate.

Next, a gate insulating film is formed on the Si substrate (S103). The gate insulating film is formed of, for example, an Si oxide film and can be formed, for example, by thermal oxidation. Then, after, for example, a polycrystalline Si film is deposited on the gate insulating film, it is subjected to patterning by using a photolithography technique and an etching technique, thereby forming a control gate electrode formed of the polycrystalline Si film (S104).

Next, on the Si substrate on which the control gate electrode is formed, a bottom Si oxide film (first potential barrier film) is formed (S105). The bottom Si oxide film is formed of, for example, an Si oxide film, and can be formed, for example, by employing thermal oxidation in an oxidizing atmosphere. Then, an electric charge holding film is formed on the bottom Si oxide film (S106). The electric charge holding film is formed of an SRN film which is an Si nitride film stoichiometrically excessively containing Si. In formation of the SRN film, for example, thermal CVD is employed. In the thermal CVD, a silicon compound and a nitrogen compound are used as raw material gases. Specifically, as the raw material gases, silane and ammonia or dichlorosilane and ammonia are used. Although the raw material gases are same as the case in which the $Si_3N_4$ film which is a stoichiometrically Si nitride film is formed, the SRN film is formed by changing the flow rate ratio of the gases. Specifically, although it will be described later, when the stoichiometrically $Si_3N_4$ film is to be formed, it is formed by setting 5 or more as the flow rate ratio of ammonia to silane. Also when dichlorosilane and ammonia are used, it is formed by setting 5 or more as the flow rate ratio of ammonia to dichlorosilane. On the other hand, when the SRN film which is the Si nitride film stoichiometrically excessively containing Si is to be formed, it is formed by setting 4 or less as the flow rate ratio of ammonia to silane or by setting 1 or less as the flow rate ratio of ammonia to dichlorosilane. The SRN film herein excessively contains Si in a range that exceeds the composition variation of the case in which the stoichiometrically $Si_3N_4$ film is formed.

Subsequently, a top Si oxide film (second potential barrier film) is formed on the electric charge holding film (S107). As well as the bottom Si oxide film, the top Si oxide film is also formed of, for example, an Si oxide film, and is formed by employing thermal oxidation.

Then, a polycrystalline Si film is formed on the top Si oxide film, and it is subjected to patterning by using the photolithography technique and the etching technique, thereby forming a memory gate electrode (S108). In the patterning, the polycrystalline Si film, the top Si oxide film, the electric charge holding film, and the bottom Si oxide film are sequentially processed; and the bottom Si oxide film, the electric charge holding film, the top Si oxide film, and the polycrystalline Si film are caused to remain merely in the side wall of the control gate electrode. Thus, the capacitance insulating film (ONO film) and the memory gate electrode of the self-aligning memory transistor are formed merely in one of the side walls of the control electrode of the selective transistor.

Next, the other side wall side of the control electrode is subjected to patterning by using the photolithography technique and the etching technique, thereby forming a selective transistor having a predetermined gate length.

Subsequently, a source region and a drain region are formed in the Si substrate in both sides of the control gate electrode, which has the side wall in which the memory gate electrode is formed, by using the photolithography technique and ion implantation (S109). Then, inter-layer insulating films and wiring are formed; thus, the non-volatile memory can be formed.

Figure 13:
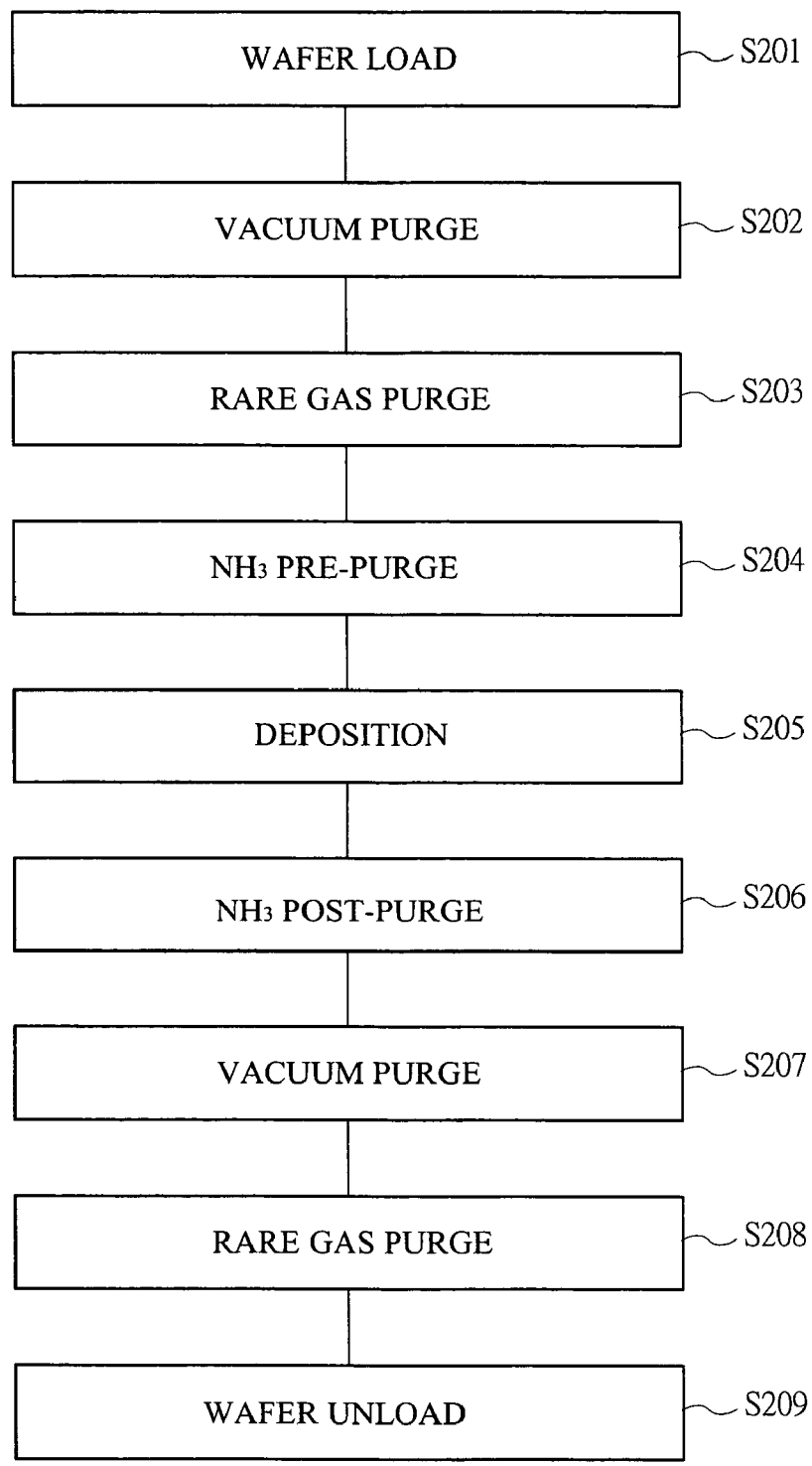
FIG. 13 is a flow chart showing a manufacturing process of the SRN film in the first embodiment.

Next, the process of forming the SRN film which is the electric charge holding film by thermal CVD will be described. FIG. 13 is a flow chart showing a process flow in a thermal CVD apparatus.

First of all, after the Si substrate (semiconductor wafer) is loaded to a film formation chamber (S201), vacuum purge (S202) and rare gas purge (S203) is performed, and the temperature of the Si substrate is stabilized. In the rare gas purge, a gas that is not reacted with under layer films is used, wherein nitrogen ($N_2$) or argon (Ar) is generally used. Next, after the rare gas purge is stopped, ammonia which serves as a raw material gas of the Si nitride film (SRN film) is introduced, and the film formation chamber is adjusted to a predetermined pressure (S204). In some cases, a rare gas is introduced at the same time as the ammonia is introduced in order to ensure film thickness uniformity. When the pressure in the film formation chamber is stabilized, a raw material gas containing Si is introduced to start film formation (deposition) (S205). In the case of thermal CVD, the most general raw material gases are dichlorosilane ($SiH_2Cl_2$) and monosilane ($SiH_4$). When the time that a desired film thickness is obtained elapses, merely the raw material gas containing Si is stopped, and post-purge of ammonia is performed (S206). After this, introduction of ammonia is stopped, vacuum purge (S207) and rare gas purge (S208) is performed, and the Si substrate is removed from the film formation chamber (S209). Thus, the SRN film which is the electric charge holding film can be formed.

The film formation by thermal CVD includes a batch method in which many wafers are treated at a time and a single-wafer method in which one wafer is treated at a time. When the film formation is carried out by the batch method, generally, dichlorosilane ($SiH_2Cl_2$) and ammonia ($NH_3$) excellent in film thickness uniformity in the batch are used as the raw material gases. In the case of the single-wafer method, film formation using silane ($SiH_4$) and ammonia is mainly employed; however, as a matter of course, film formation by dichlorosilane and ammonia can be also performed.

The above described film formation flow of the Si nitride film by the thermal CVD is approximately the same in the case in which the stoichiometrically $Si_3N_4$ film is formed and the case in which the SRN film stoichiometrically excessively containing Si is formed. Hereinafter, differences between the film formation methods of the SRN film and the $Si_3N_4$ film by the thermal CVD shown as specific modes will be described.

In the film formation of the $Si_3N_4$ film by the thermal CVD, generally, the introduced amount of the raw material gas containing nitrogen is set to be larger than the introduced amount of the raw material gas containing Si, so as to form the film.

Figure 14:
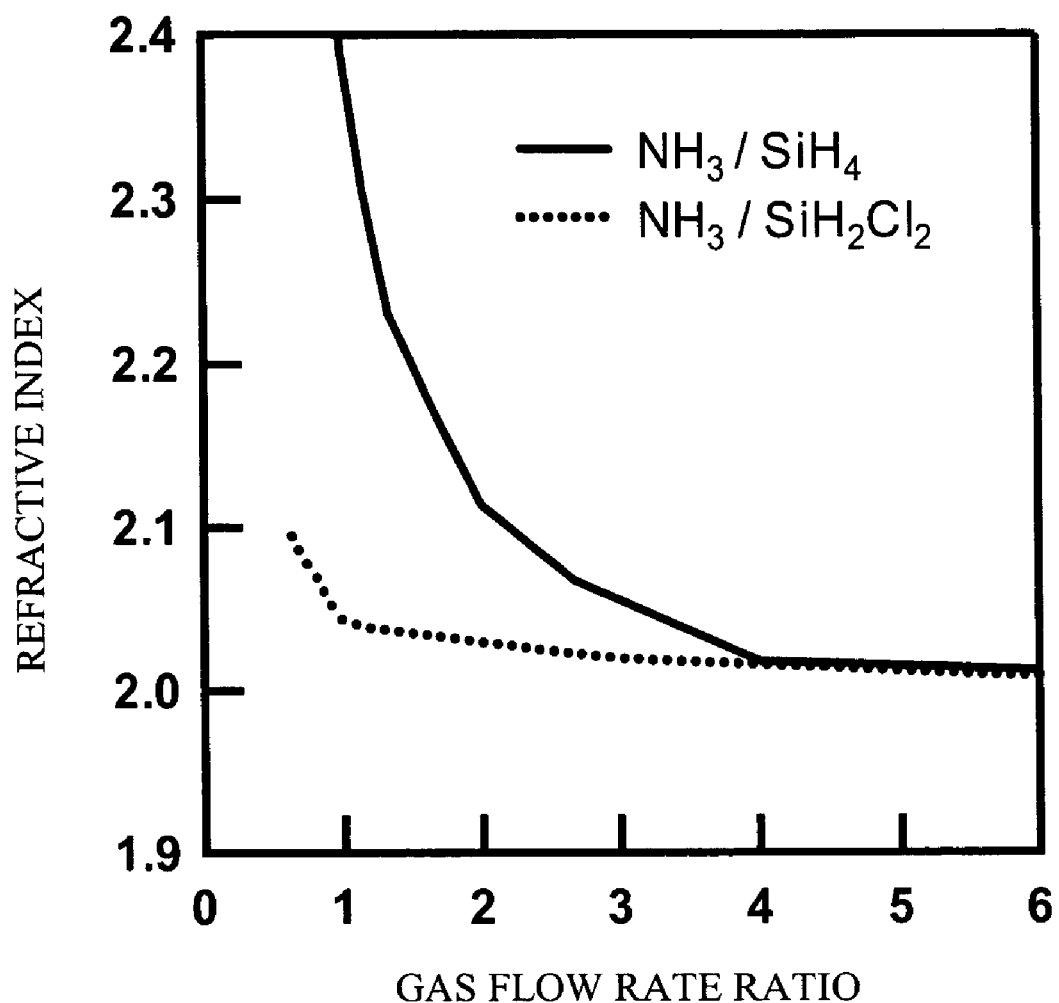
FIG. 14 is a graph showing the relation between flow rate ratios of raw material gases and refractive indexes upon manufacturing of an SRN film.

FIG. 14 is a diagram showing the relation between gas flow rate ratios for film formation and the refractive index of the Si nitride film. The refractive index is the value measured by ellipsometry using a He—Ne laser (wavelength: 633 nm). The gas flow rate ratio represents the ratio of a $NH_3$ flow rate to a flow rate of a raw material gas containing Si. The solid line represents a $NH_3/SiH_4$ flow rate ratio, and the broken line represents a $NH_3/SiH_2Cl_2$ flow rate ratio. When silane ($SiH_4$) is used, the refractive index increases from the region in which the gas flow rate ratio is about four or less. When dichlorosilane ($SiH_2Cl_2$) is used, the refractive index increases from the region in which the gas flow rate ratio is about one or less. The refractive index of $Si_3N_4$ film having the composition of the stoichiometric ratio thereof is 2.0, and the diagram shows that the Si nitride film having a refractive index larger than that is the Si nitride film (SRN film) stoichiometrically excessively containing Si.

Generally, the $Si_3N_4$ film used in an Si semiconductor device is formed by the gas flow rate ratio that does not increase the refractive index more than about 2.0 even when the gas flow rate ratio is somewhat changed. That is, when it is indicated in FIG. 14, the film formation is generally performed in the range wherein the gas flow rate ratio is 5 or more.

Meanwhile, in the first embodiment, the SRN film is intentionally formed. Therefore, the gas flow rate ratio is adjusted, and film formation is performed in the range in which the refractive index is larger than 2.0. Specifically, as shown in FIG. 14, when a silane gas and ammonia are used as raw material gases, film formation is performed in the range in which the flow rate ratio of ammonia to silane is 4 or less. Meanwhile, when dichlorosilane and ammonia are used as raw material gases, film formation is performed in the range in which the flow rate ratio of ammonia to dichlorosilane is 1 or less. As described above, the SRN film stoichiometrically excessively containing Si can be formed by increasing the ratio of the raw material gas containing Si. The SRN film used in the first embodiment is the Si nitride film excessively containing Si in the range in which the refractive index is larger than 2.0, in other words, in the range that exceeds composition variation of the $Si_3N_4$ film Second Embodiment A second embodiment of the present invention will be described in detail by using FIG. 15 to FIG. 24. A non-volatile memory cell which is the second embodiment of the present invention has a structure which is basically same as the structure shown in FIG. 1 of the first embodiment, and merely the configuration of the electric charge holding film 106 and the composition of the SRN film are different.

Figures 15, 16:
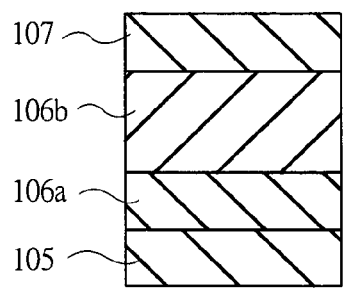
FIG. 15 is a cross sectional view showing a configuration of a capacitance insulating film of a non-volatile memory in a second embodiment.
FIG. 16 is a table showing formation conditions of an electric charge holding film in the second embodiment.

FIG. 15 shows the configuration of a capacitance insulating film of the memory transistor of the second embodiment. In the second embodiment, the electric charge holding film is formed by a laminated structure of an SRN film 106a stoichiometrically excessively containing silicon and a stoichiometrically $Si_3N_4$ film 106b. The composition of the SRN film 106a is x=0.2, and the film thickness ratio of the SRN film 106a and the $Si_3N_4$ film 106b is used as a parameter. The composition of the SRN film used in the second embodiment is x=0.2 and excessively contains Si more than the first embodiment in which x=0.07. Herein, the film thickness ratio is described as Rt and defined as $Rt=(t_{SRN})/(t_{Si3N4}+t_{SRN})$. Note that the total film thickness of the film thickness of the SRN film 106a and the $Si_3N_4$ film 106b is constant at 10 nm.

FIG. 16 shows sample configurations which are compared in the second embodiment. A sample A is a single layer film of an $Si_3N_4$ film and has a sample configuration same as that shown in the sample A of the first embodiment. A sample D has a laminated structure of an SRN film and an $Si_3N_4$ film, wherein Rt=0.4 (SRN film=4 nm, $Si_3N_4$ film=6 nm). A sample E also has a laminated structure of an SRN film and an $Si_3N_4$ film, wherein Rt=0.6 (SRN film=6 nm, $Si_3N_4$ film=4 nm). The voltages applied to the regions and measurement conditions are same as that in the first embodiment.

Figure 17:
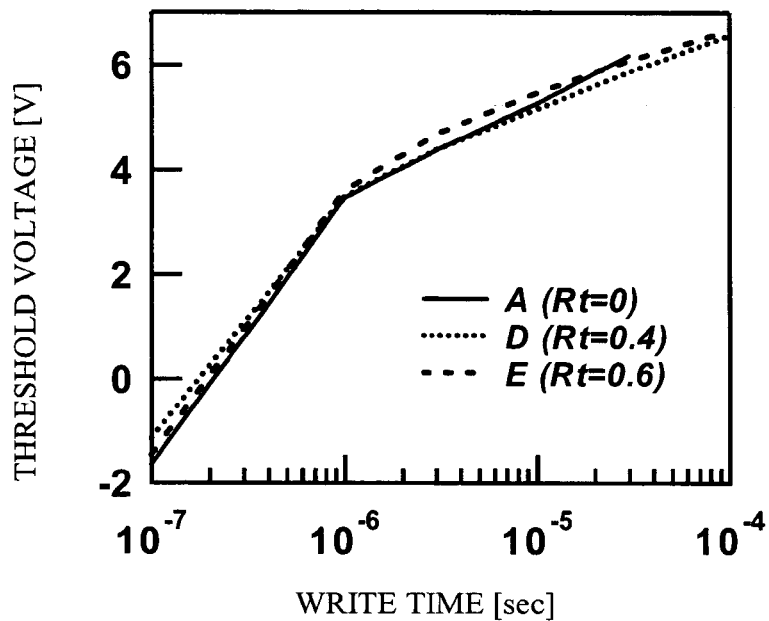
FIG. 17 is a graph showing comparison of write characteristics in the second embodiment.
Figure 18:
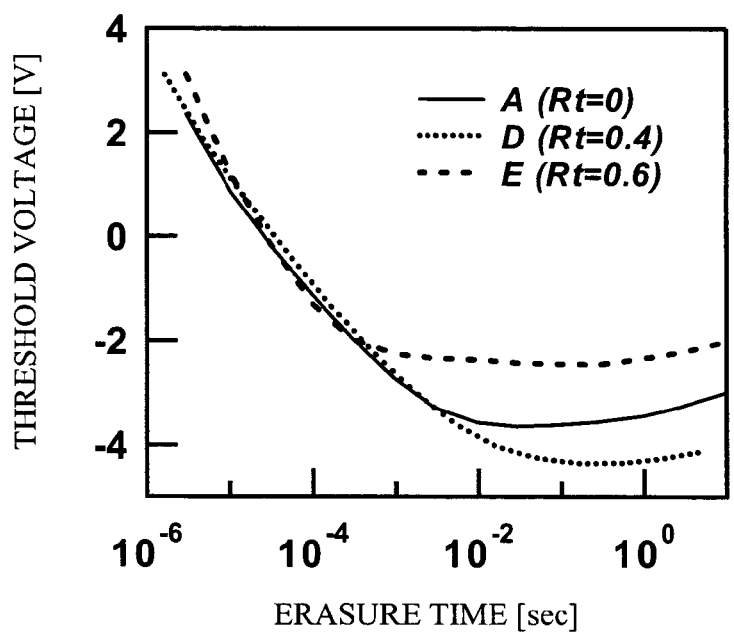
FIG. 18 is a graph showing comparison of erasure characteristics in the second embodiment.

FIG. 17 shows comparison of write characteristics, and FIG. 18 shows comparison of erasure characteristics. As well as the first embodiment, measurement is performed after ten times of verification writing is performed on samples which have not undergone rewriting. Note that, PV=5V, and EV=−2V. In the write characteristics, approximately equivalent results are obtained in all the samples. Meanwhile, when the erasure characteristics are compared, it can be understood that, in the sample D of Rt=0.4, erasure is performed to a level which is deeper than that of the sample A composed of the single layered $Si_3N_4$ film. It can be understood that, inversely, in the sample E of Rt=0.6, erasure is performed merely to a level which is shallower than that of the sample A composed of the single layered $Si_3N_4$ film. As described in the first embodiment, the leakage current of the ONO film upon an erasure operation is also relevant to this. More specifically, in the sample D of Rt=0.4, since the SRN film (composition x=0.2) excessively containing Si more than the composition of the first embodiment (x=0.07) is used, local presence of electrons and holes can be further mitigated; furthermore, since the laminated structure of the SRN film and the $Si_3N_4$ film is employed, the leakage current of the ONO film can be suppressed to a level which does not cause a big problem. Therefore, erasure can be performed to the level deeper than that of the sample A. On the other hand, in the sample E of Rt=0.6, although local presence of electrons and holes is mitigated, the ratio of the film thickness of the SRN film 106a is larger than the film thickness of the $Si_3N_4$ film 106b which suppresses the leakage current; therefore, the leakage current of the ONO film increases. Therefore, since electrons flow in from the memory gate electrode side when holes are to be injected into the electric charge holding film, erasure is performed merely to the level shallower than that of the sample A. As described above, it can be understood that, when the SRN film 106a and the $Si_3N_4$ film 106b are formed as a laminated structure, the leakage current can be reduced while increasing the composition x of the SRN film 106a; however, when the film thickness of the SRN film 106a is increased too much against the film thickness of the $Si_3N_4$ film 106b, the leakage current of ONO film becomes problematic.

Figure 19:
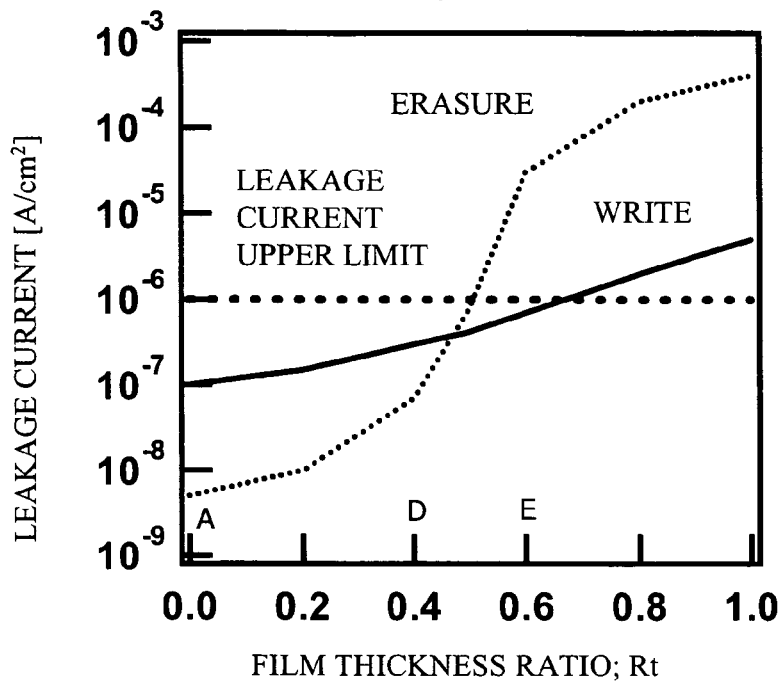
FIG. 19 is a graph showing the relation between the film thickness ratio of an SRN film and an $Si_3N_4$ film and leakage currents of a MONOS capacitor.

FIG. 19 is a diagram showing the relation between leakage currents of a MONOS capacitor fabricated on a p-type Si substrate and film thickness ratios Rt of an electric charge holding film. The configuration of the capacitor insulating film (ONO film) comprises bottom Si oxide film (4 nm)/ electric charge holding film (10 nm)/top Si oxide film (6 nm). Rt=0 corresponds to an $Si_3N_4$ single layer film, Rt=1 corresponds to an SRN single layer film. Note that the film composition of the SRN films is constant at x=0.2. The solid line represents the leakage current upon write voltage application, and the broken line represents the leakage current upon erasure voltage application. The leakage currents when 100 microseconds elapse after the voltage application are shown.

As is clear from FIG. 19, when the film thickness ratio Rt of the electric charge holding film is increased (film thickness ratio of the SRN film is increased), the leakage current increases. As shown in the first embodiment, the leakage current of the ONO film at which writing/erasure can be favorably performed is $Jg=1$ $\mu A/cm^2$ or less. In terms of writing conditions, the leakage currents of all the three samples are those with which writing can be performed; therefore, the write characteristics shown in FIG. 17 are not different from one another. Meanwhile, in terms of erasure conditions, the merely the sample E (Rt=0.6) exceeds the upper limit of the leakage current. Therefore, erasure is performed merely to the shallow level in the sample E. Rt dependency of the leakage current can be explained by electron injection from the top Si oxide film side.

Figure 20:
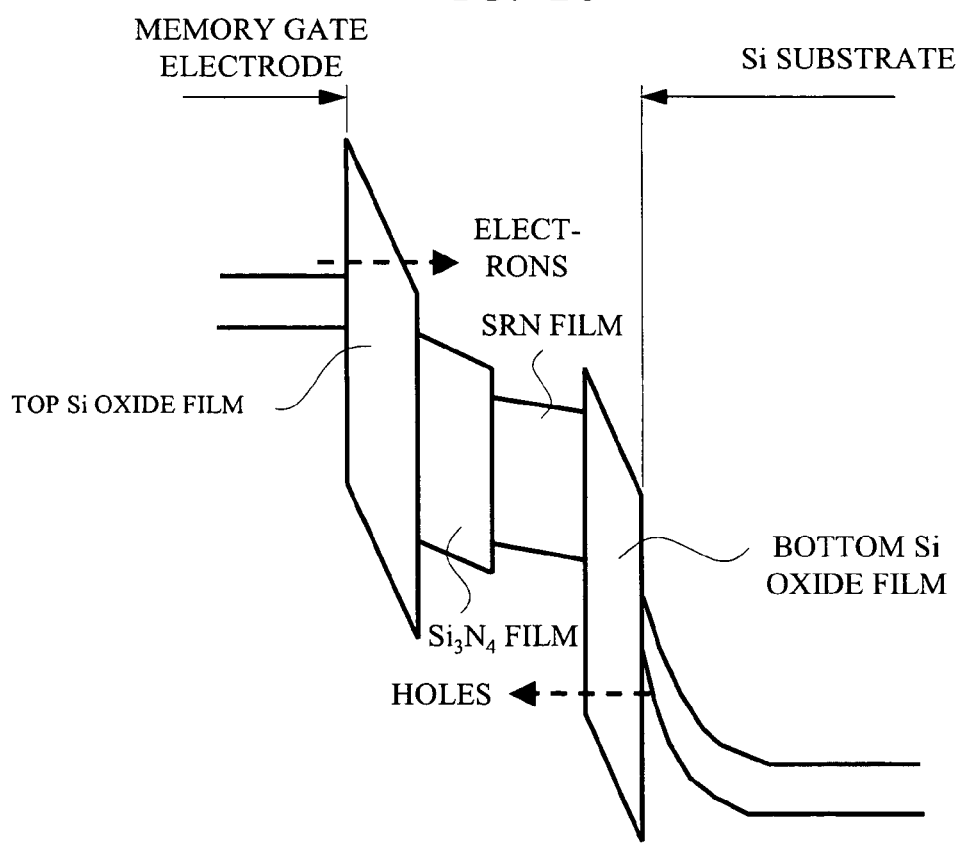
FIG. 20 is a diagram showing a band diagram of the non-volatile memory upon erasure voltage application.

FIG. 20 is a schematic diagram of a band diagram when a certain period of time elapses after an erasure operation. In the second embodiment, although the Si-excessive SRN film 106a having the film composition x=0.2 wherein the leakage current is extremely large is used, when the laminated structure with the $Si_3N_4$ film 106b wherein the leakage current is small is employed, the leakage current of the ONO film in whole can be significantly reduced. However, as shown in FIG. 20, when the electrons held in the electric charge holding film are erased to some extent, the electric field applied to the top Si oxide film and the $Si_3N_4$ film becomes large. This becomes more noticeable as the film thickness ratio (Rt) of the SRN film having small resistivity increases. Therefore, when Rt is increased, the amount of electrons injected from the memory gate electrode side increases, and the erasure level upon erasure becomes shallow.

Therefore, when the SRN film is used as a part of the electric charge holding film, the composition of the SRN film and the film thickness ratio have to be selected in the range that the leakage current does not increase upon a writing operation and an erasure operation. When the top Si oxide film is set somewhat thicker so as to suppress FN leakage of electrons, a wide composition range and a wide range of the film thickness ratio in which the SRN film can be used can be ensured.

Figure 21:
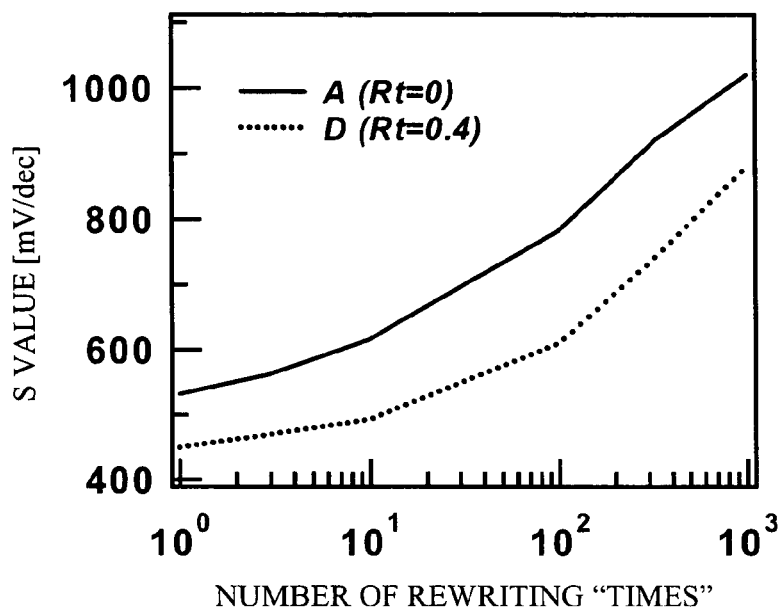
FIG. 21 is a graph showing the relation between the number of rewriting and the subthreshold coefficient.
Figure 22:
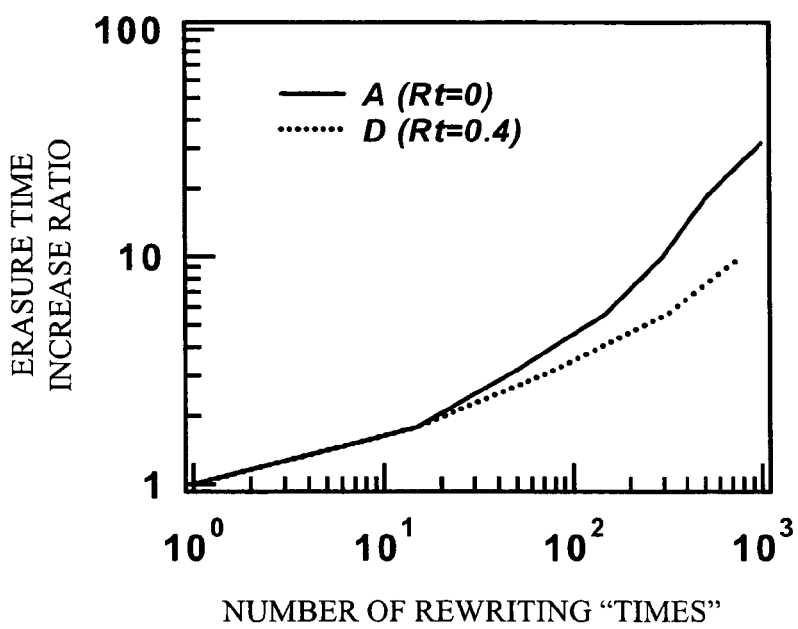
FIG. 22 is a graph showing the relation between the number of rewriting and an erasure time increase ratio.

Next, rewriting durability will be described. FIG. 21 shows comparison of variation in the subthreshold coefficient (S value) against the number of rewriting, and FIG. 22 shows the increase ratio of erasure time. Herein, the sample A ($Si_3N_4$ single layer film) and the sample D (SRN film/$Si_3N_4$ film, Rt=0.4) in which write/erasure can be normally performed are compared. Note that rewriting is performed as verification rewriting so that PV=5V and EV=−1V. The erasure time increase ratio of FIG. 22 is shown as the ratio between the erasure time of a first time and the erasure time of an n-th time. As is clear from both the diagrams, both the variation amount of the S value and the erasure time increase ratio are smaller in the sample D of the SRN/$Si_3N_4$ laminated film compared with the sample A using the $Si_3N_4$ single layer film. This is for the reason that local presence of the electrons and holes that accompany rewriting is suppressed since the Si composition ratio of the SRN film is large.

Figure 23:
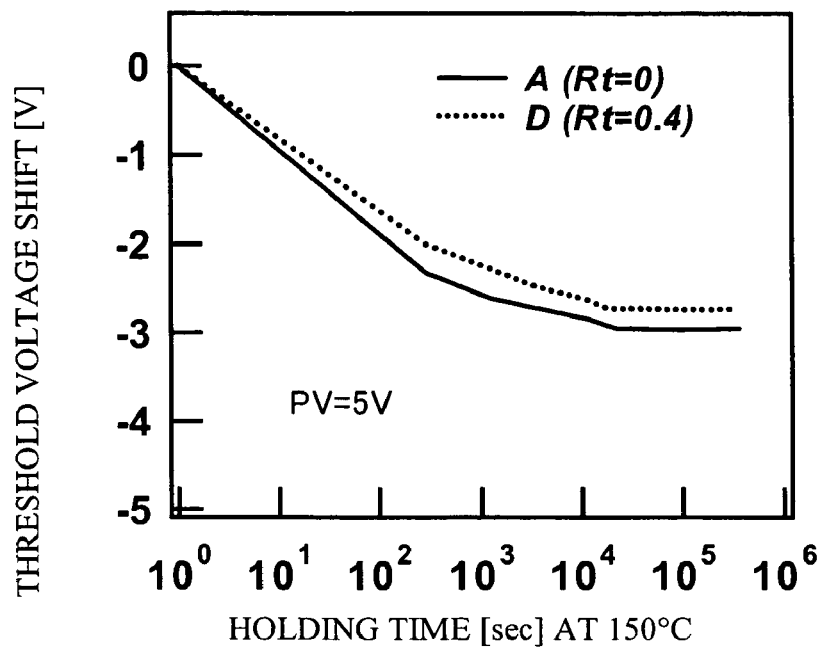
FIG. 23 is a graph showing data holding characteristics in writing.
Figure 24:
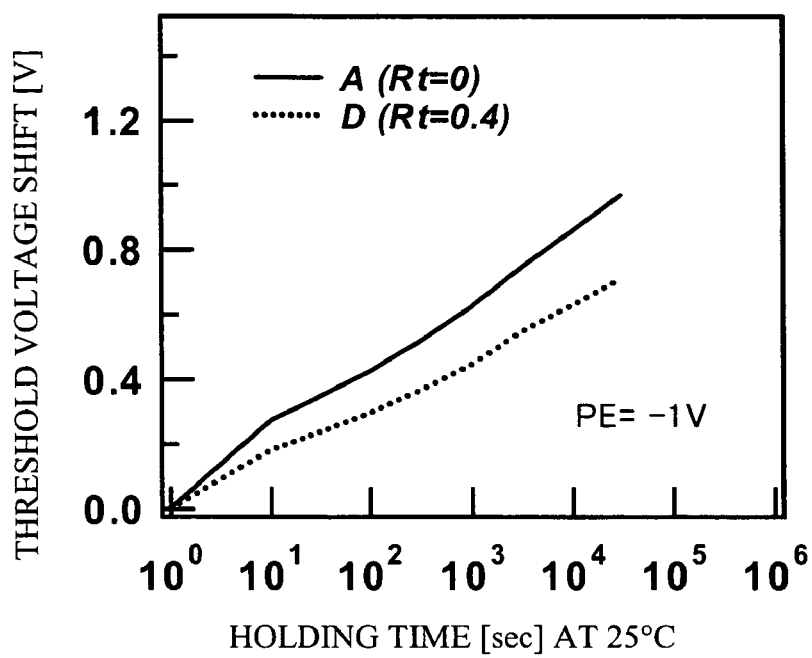
FIG. 24 is a graph showing data holding characteristics in erasure.

FIG. 23 and FIG. 24 are diagrams showing comparison of data holding characteristics. FIG. 23 shows data holding characteristics of the write side (PV=5V), and FIG. 24 shows data holding characteristics of the erasure side (EV=−1V). Both of them are plotted from voltage variation amounts from the beginning. FIG. 23 shows results of the data holding characteristics in the write side at no voltage and at 150° C., and FIG. 24 shows results of the data holding characteristics of the erasure side measured in the state in which Vmg=1.5V is applied (bias acceleration retention) at 25° C. In the write side characteristics, there is no significant difference between the $Si_3N_4$ single layer film and the $SRN/Si_3N_4$ laminated film. However, in the erasure side characteristics, the $SRN/Si_3N_4$ laminated film shows a better characteristic. This is for the reason that, as well as the first embodiment, increase in the hole injection amount required for erasure can be suppressed by using the $SRN/Si_3N_4$ laminated film, and, as a result, deterioration of the bottom Si oxide film can be suppressed.

When the electric charge holding film is caused to be the laminated film of the SRN film and the $Si_3N_4$ film in the above described manner, the Si composition range in which the leakage current does not increase can be set higher than the case in which the SRN single layer film is used. Therefore, local presence of electrons and holes can be further reduced, and the holes and the electrons can be efficiently recombined with each other. As a result, the both electric charge injection type MONOS memory further excellent in rewriting durability can be realized.

In the second embodiment, the laminated structure of the SRN film and the $Si_3N_4$ film is employed as the configuration of the electric charge holding film; however, sometimes a thin Si oxide film is present between the SRN film 106a and the $Si_3N_4$ film 106b in reality. This is for the reason that, in the case in which the SRN film 106a and the $Si_3N_4$ film 106b are formed by different apparatuses, a natural oxide film is formed on the surface of the SRN film 106a by oxygen in an atmosphere. Even if the Si oxide film is present between the SRN film and the $Si_3N_4$ film in this manner, there is no problem as long as the film thickness thereof is within the film thickness range in which electrons and holes can directly cause tunneling. In other words, as long as the film thickness is 1.5 nm or less, effects similar to that of the present invention can be obtained.

Also, the film configuration of the electric charge holding film is exemplary shown as the laminated film of the SRN film and the $Si_3N_4$ film which are laminated from the Si substrate side in the second embodiment; however, there is no problem even when the arrangement of the SRN film in the electric charge holding film is changed. For example, a two-layer structure in which the $Si_3N_4$ film and the SRN film are laminated from the Si substrate side, or a three-layer structure such as an $Si_3N_4/SRN/Si_3N_4$ laminated film or an $SRN/Si_3N_4/SRN$ laminated film can be also applied. However, the composition and the film thickness ratio of the SRN film have to be set within the range that the leakage current of the ONO film upon writing/erasure operations is not increased too much.

The write characteristics, the erasure characteristics, the write durability, and the data holding characteristics have been described hereinabove by describing the second embodiment as an example. However, the absolute values of the numerical values of the measurement conditions and the measurement environments are examples, and the present invention is not limited by these numerical values. Also, in the present invention, the element structure as shown in FIG. 1 in which the memory transistor is formed in the side wall portion of the selective transistor in the self-aligning manner is shown as an example; however, an element having a structure in which the control gate electrode of the selective transistor is placed over the memory transistor, or the opposite element structure in which the memory gate electrode of the memory transistor is placed over the selective transistor can be also employed.

Note that the manufacturing method of the non-volatile memory in the second embodiment is approximately same as that of the first embodiment. A different point is that the electric charge holding film is formed by the laminated film of the SRN film and the $Si_3N_4$ film. In formation of the thus-configured electric charge holding film, for example, thermal CVD can be employed. The SRN film and the $Si_3N_4$ film can be laminated and formed by adjusting the flow rate ratio of raw material gases. For example, when dichlorosilane and ammonia are used as raw material gases, the SRN film can be formed by setting 1 or less as the flow rate ratio of the ammonia to dichlorosilane, and then the $Si_3N_4$ film can be formed by setting 5 or more as the flow rate ratio of ammonia to dichlorosilane. Similarly, when silane and ammonia are used as the raw material gases, the SRN film can be formed by setting 4 or less as the flow rate ratio of ammonia to silane, and then the $Si_3N_4$ film can be formed by setting 5 or more as the flow rate ratio of ammonia to silane.

Third Embodiment

Figures 25, 26, 27:
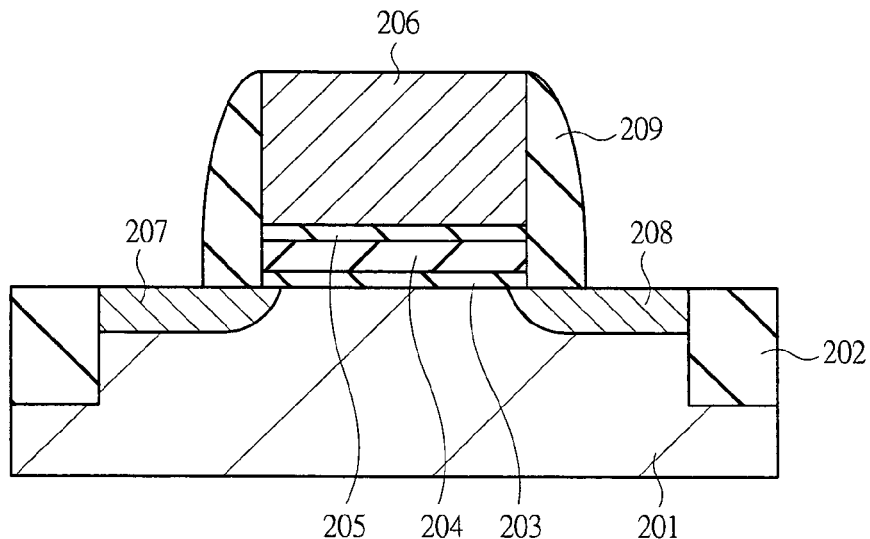
FIG. 25 is a cross sectional view of a substantial part of a non-volatile memory in a third embodiment.
FIG. 26 is a table showing formation conditions of an electric charge holding film in the third embodiment.
FIG. 27 is a table showing examples of operation conditions of the non-volatile memory in the third embodiment.
Figure 28:
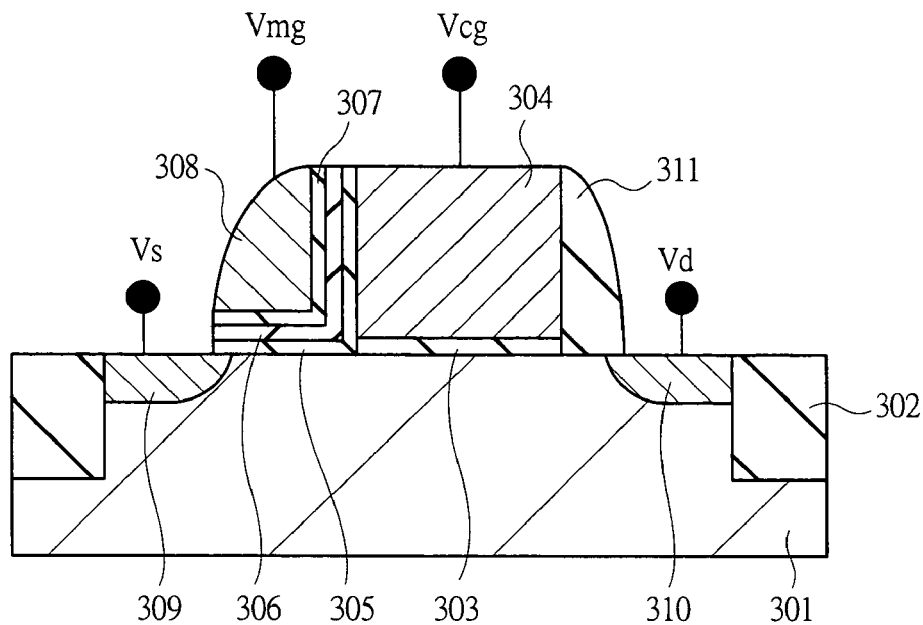
FIG. 28 is a cross sectional view of a substantial part of a non-volatile memory that the present inventors have studied.
Figure 29:
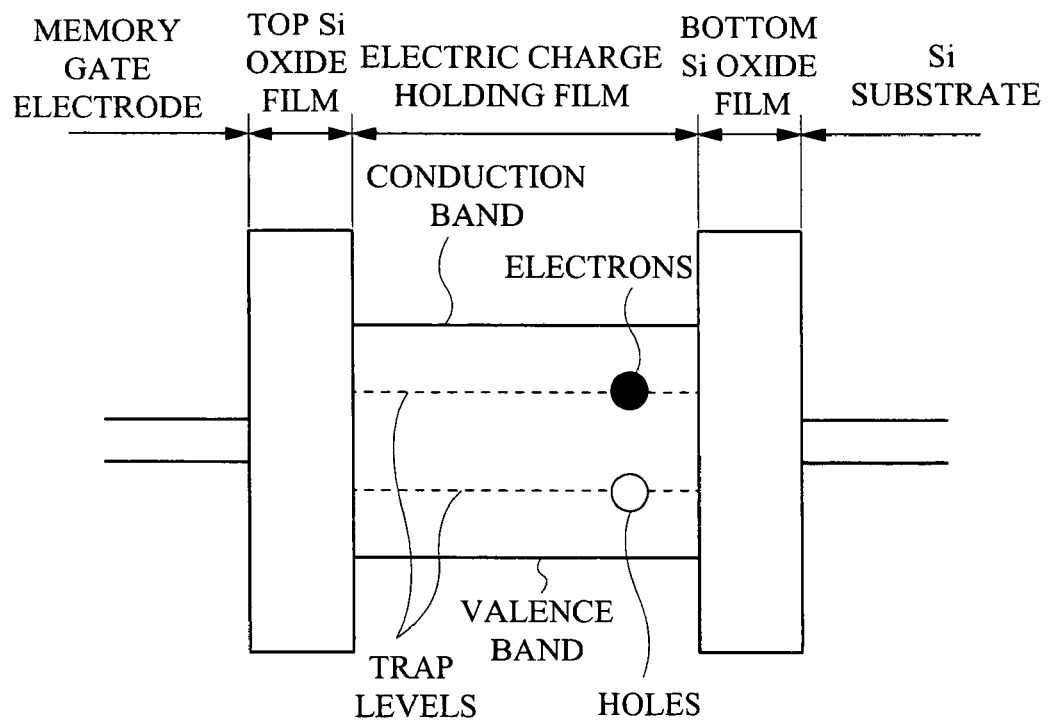
FIG. 29 is a diagram showing a band diagram of the non-volatile memory that the present inventors have studied.
Figure 30:
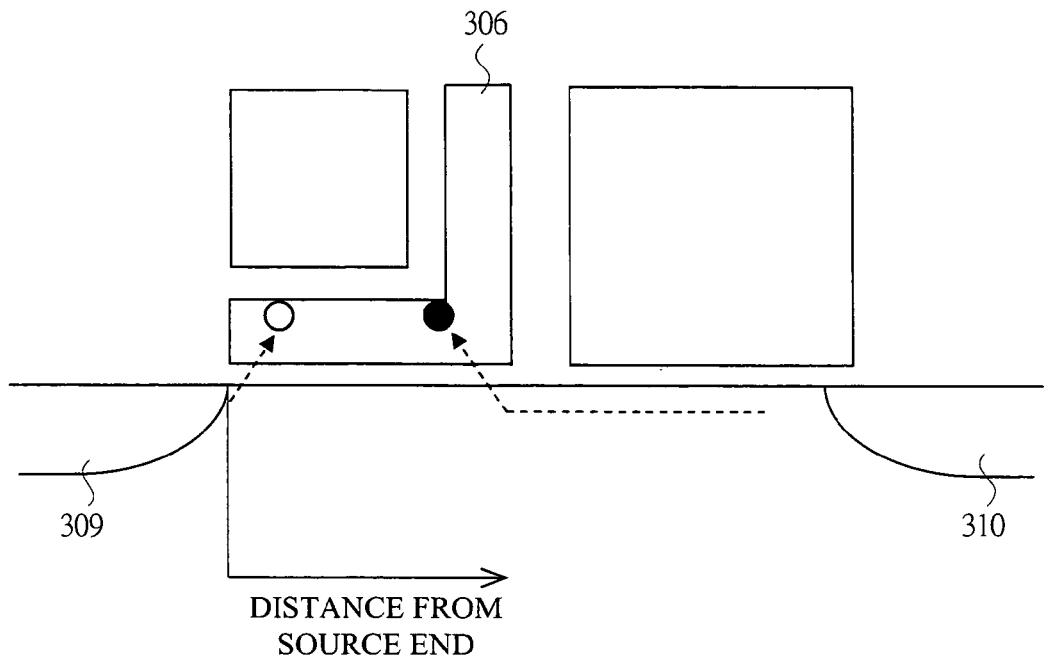
FIG. 30 is a diagram explaining injection locations of electrons and holes in the non-volatile memory that the present inventors have studied.

Next, a third embodiment of the present invention will be described by using FIG. 25 to FIG. 27. A non-volatile memory cell which is the third embodiment of the present invention is a non-volatile memory cell composed of one memory transistor as shown in FIG. 25; however, basically, it has a structure approximately same as the structure of the memory transistor region of the split-gate type non-volatile memory cell shown in the first embodiment. Although wiring is present in an upper layer of FIG. 25 in practice, it is omitted also in this drawing.

The non-volatile memory cell (MONOS memory cell) is composed of one MOS transistor having a p-type well region 201, isolation regions 202, an n-type diffusion layer (n-type semiconductor region) serving as a drain region 207, an n-type diffusion layer (n-type semiconductor region) serving as a source region 208, a capacitance insulating film, and an n-type polycrystalline Si film serving as a gate electrode 206 provided on an Si substrate (semiconductor substrate). In addition, in both-side side walls of the gate electrode 206, sidewalls 209 are formed.

In writing of the non-volatile memory cell, channel hot electrons generated in the vicinity of the source region 208 are used; and, in erasure, hot holes generated in an end of the source 208 are used. Both the electric charges are injected into an electric charge holding film 204. Examples of the writing, erasure, and reading conditions of the non-volatile memory cell in the third embodiment are shown in FIG. 27.

The capacitance insulating film is composed of a bottom Si oxide film 203 serving as a lower layer potential barrier film, the electric charge holding film 204, and a top Si oxide film 205 serving as an upper layer potential barrier film. The thicknesses of the bottom Si oxide film 203 and the top Si oxide film 205 are 4 nm and 6 nm, respectively.

In a MONOS memory (split gate type) having a selective transistor like that shown in the first embodiment, since a read current of an unselected cell can be cut off by the selective transistor, the threshold voltage of the memory transistor can be reduced to 0 V or less. In addition, it has an advantage that high-speed reading can be performed since the reading speed can be controlled by the high-performance selective transistor which operates at a low voltage.

On the other hand, in the MONOS memory not having any selective transistor like that shown in the third embodiment, since the same read voltage is applied to selected cells and unselected cells, a small (about 2 V) threshold voltage (Vth) cannot be set because of reading limitation. Moreover, high-speed reading like the split-gate type is difficult since reading is also determined by the performance of the memory transistor which requires a high voltage. However, since the distributions of captured electrons and holes in terms of space are very close, it has advantages that local presence of both the electric charges can be suppressed compared with the split-gate type, and it is excellent in rewriting durability.

In the third embodiment, as shown in FIG. 26, three samples (A, F, and G) having different compositions and film thickness ratios of the electric charge holding film are prepared. The sample A is a single layer film having a stoichiometric ratio of $Si_3N_4$, the sample F is an SRN single layer film (composition x=0.07), and the sample G is an SRN/$Si_3N_4$ laminated film (film thickness ratio Rt=0.4, composition x=0.2). In the third embodiment, all the film configuration and the manufacturing process except for that of the electric charge holding film 204 are same as those described above.

Also in the third embodiment, as well as the first embodiment, write characteristics, erasure characteristics, rewrite characteristics, and data holding characteristics after rewriting are compared. As a result, in the sample F using the SRN single layer film and the sample G using SRN/$Si_3N_4$ laminated film, the data holding characteristic in the erasure side is significantly improved compared with the sample A of the $Si_3N_4$ single layer film. Thus, the number of rewriting can be remarkably improved.

As described above, when the SRN film in which the Si composition is increased within the range that the leakage current is not increased in a writing operation and an erasure operation is used as the electric charge holding film, the both electric charge injection type MONOS memory excellent in rewriting durability can be realized regardless of the cell structure of the MONOS memory. In other words, the performance of the non-volatile semiconductor storage device of the both electric charge rewriting type (writing by electron injection, erasure by hole injection) can be improved. Particularly, increase in the electric charge injection amount accompanying rewriting can be suppressed, and the rewriting durability and the electric charge holding characteristic can be improved.

Note that the absolute values of the voltage conditions shown in FIG. 27 are examples, and the present invention is not limited by these numerical values. As a matter of course, the present invention is not limited to the MONOS memory structures shown in the first to third embodiments, but also can be employed in general MONOS memories using both electric charge injection.

Next, a manufacturing method of the non-volatile memory in the third embodiment will be described. First of all, isolation regions for isolating elements are formed on an Si substrate (semiconductor substrate). The isolation regions can be formed by STI in which, for example, a trench is formed in the Si substrate, an Si oxide film is formed on the Si substrate including the interior of the trench, and then the Si oxide film is caused to remain merely in the trench by employing chemical mechanical polishing.

Subsequently, by employing a photolithography technique and ion implantation, a p-type well is formed in an active region between the isolation regions. The p-type well is formed, for example, by introducing a p-type impurity such as boron into the Si substrate.

Next, on the Si substrate, a bottom Si oxide film (first potential barrier film) is formed. The bottom Si oxide film is formed of, for example, an Si oxide film, and can be formed, for example, by employing thermal oxidation. Then, an electric charge holding film is formed on the bottom Si oxide film. The electric charge holding film is formed of an SRN film which is an Si nitride film stoichiometrically excessively containing Si. In formation of the SRN film, for example, thermal CVD is employed. In the thermal CVD, a silicon compound and a nitrogen compound are used as raw material gases. Specifically, as the raw material gases, silane and ammonia or dichlorosilane and ammonia are used. Although the raw material gases are same as the case in which the $Si_3N_4$ film which is a stoichiometrically Si nitride film is formed, the SRN film is formed by changing the flow rate ratio of the gases. When the SRN film which is the Si nitride film stoichiometrically excessively containing Si is to be formed, it is formed by setting 4 or less as the flow rate ratio of ammonia to silane, or formed by setting 1 or less as the flow rate ratio of ammonia to dichlorosilane.

Subsequently, a top Si oxide film (second potential barrier film) is formed on the electric charge holding film. As well as the bottom Si oxide film, the top Si oxide film is also formed of, for example, an Si oxide film, and is formed by employing thermal oxidation.

Then, a polycrystalline Si film is formed on the top Si oxide film, and it is subjected to patterning by using the photolithography technique and the etching technique, thereby forming a gate electrode. In the patterning, the bottom Si oxide film, the electric charge holding film, the top Si oxide film, and the polycrystalline Si film are sequentially processed. Then, a source region and a drain region are formed in the Si substrate at both sides of the gate electrode. Subsequently, after sidewalls are formed at the side walls of the gate electrode, inter-layer insulating films and wiring are formed; thus the non-volatile memory can be formed.

Hereinabove, the invention accomplished by the present inventors has been described in detail based on the embodiments; however, the present invention is not limited to the above described embodiments, and it goes without saying that various modifications can be made without departing from the scope of the invention.

The non-volatile memories of the present invention can be loaded on various devices, for example, they can be used in microcomputers.

The present invention can be widely utilized in manufacturing industry wherein non-volatile semiconductor storage devices are manufactured.

What is claimed is:

1. A non-volatile semiconductor storage device including a memory transistor and a select transistor and having a split-gate configuration, the storage device comprising:
   (a) first and second semiconductor regions formed in a semiconductor substrate, the first semiconductor region being a source region, and the second semiconductor region being a drain region;
   (b) a first electric conductor and a second electric conductor both formed above a part of the semiconductor substrate that is between the first and second semiconductor regions, the first electric conductor being a control gate electrode of the select transistor, and the second electric conductor being a memory gate electrode of the memory transistor;

(c) a first insulating film formed between the first electric conductor and the semiconductor substrate; and (d) a second insulating film formed between the second electric conductor and the semiconductor substrate, wherein the second insulating film includes a first potential barrier film formed on the semiconductor substrate, an electric charge holding film formed above the first potential barrier film, and a second potential barrier film formed above the electric charge holding film, wherein the non-volatile semiconductor storage device writes information by injecting electrons into the electric charge holding film and erases the information by injecting holes into the electric charge holding film, and wherein the electric charge holding film includes:

a first silicon nitride film consisting of silicon and nitrogen and containing a stoichiometrically excessive amount of silicon, and a second silicon nitride film formed on the first silicon nitride film and consisting of silicon and nitrogen of a stoichiometric ratio.

2. The non-volatile semiconductor storage device according to claim 1, wherein the first silicon nitride film has a thickness greater than a thickness of the second silicon nitride film.

3. The non-volatile semiconductor storage device according to claim 1, wherein hot electrons and hot holes which are generated in the semiconductor substrate and which have energies exceeding a barrier potential of the first potential barrier film are injected into the electric charge holding film.

4. The non-volatile semiconductor storage device according to claim 1, wherein the electric charge holding film further includes a third silicon nitride film formed on the second silicon nitride film, the third silicon nitride film consisting of silicon and nitrogen and containing a stoichiometrically excessive amount of silicon.

5. The non-volatile semiconductor storage device according to claim 1, wherein the electric charge holding film further includes a third silicon nitride film formed over the semiconductor substrate and consisting of silicon and nitrogen of a stoichiometric ratio, and wherein the first silicon nitride film is formed on the third silicon nitride film.

* * * * *